US010063261B1

(12) United States Patent
Croxall, II et al.

(10) Patent No.: US 10,063,261 B1
(45) Date of Patent: Aug. 28, 2018

(54) COMMUNICATION ENDPOINTS AND RELATED METHODS FOR FORWARD ERROR CORRECTION OF PACKETIZED DATA

(71) Applicant: Sorenson IP Holdings LLC, Salt Lake City, UT (US)

(72) Inventors: Alan Croxall, II, Salt Lake City, UT (US); Jeremiah Long, Salt Lake City, UT (US); Jason Briggs, Salt Lake City, UT (US); Isaac Roach, Murray, UT (US)

(73) Assignee: Sorenson IP Holdings LLC, Salt Lake City, UT (US)

( * ) Notice: Subject to any disclaimer, the term of this patent is extended or adjusted under 35 U.S.C. 154(b) by 125 days.

(21) Appl. No.: 14/882,118

(22) Filed: Oct. 13, 2015

(51) Int. Cl.
  *H03M 13/29* (2006.01)
  *H04L 1/00* (2006.01)
  *H03M 13/00* (2006.01)

(52) U.S. Cl.
  CPC ... *H03M 13/2921* (2013.01); *H03M 13/6522* (2013.01); *H04L 1/0041* (2013.01)

(58) Field of Classification Search
  None
  See application file for complete search history.

(56) References Cited

U.S. PATENT DOCUMENTS

| | | | | |
|---|---|---|---|---|
| 4,796,260 A * | 1/1989 | Schilling | ............... | H03M 13/05 714/755 |
| 5,993,056 A * | 11/1999 | Vaman | ................... | H03M 13/11 714/755 |
| 6,182,264 B1 * | 1/2001 | Ott | ........................ | H03M 13/09 714/774 |
| 6,871,317 B1 * | 3/2005 | Corbett | ............... | G06F 11/1076 714/800 |
| 6,961,890 B2 * | 11/2005 | Smith | ................. | G06F 11/1012 714/718 |
| 7,430,706 B1 | 9/2008 | Yuan et al. | | |
| 8,230,316 B2 * | 7/2012 | Melliar-Smith | .. | H03M 13/2921 714/801 |
| 8,307,261 B2 * | 11/2012 | Wu | ...................... | G06F 11/1068 365/200 |
| 8,335,966 B1 * | 12/2012 | Lary | ................... | G06F 11/1076 714/6.24 |
| 8,473,833 B2 | 6/2013 | Melliar-Smith et al. | | |

(Continued)

*Primary Examiner* — Steve Nguyen
(74) *Attorney, Agent, or Firm* — TraskBritt

(57) ABSTRACT

Communication endpoints and related methods for forward error correction (FEC) are disclosed. A communication endpoint includes control circuitry including a packetizer configured to segment near-end data into groups of near-end data packets, and a forward error correction (FEC) packet generator configured to generate at least two near-end FEC packets for each group of near-end data packets. A method includes generating the FEC packets, and transmitting the data packets and the FEC packets to a far-end communication endpoint. A communication endpoint includes control circuitry including a forward error correction repairer configured to use far-end FEC packets to repair groups of far-end data packets. A method includes receiving a group of far-end data packets and corresponding far-end FEC packets, and repairing far-end data packets with the corresponding far-end FEC packets.

22 Claims, 22 Drawing Sheets

(56) References Cited

U.S. PATENT DOCUMENTS

| | | | |
|---|---|---|---|
| 8,595,606 B1 * | 11/2013 | Feng | H03M 13/2909 |
| | | | 714/800 |
| 8,751,910 B2 | 6/2014 | Farhoodfar et al. | |
| 8,959,418 B1 | 2/2015 | Pfister et al. | |
| 9,608,767 B2 * | 3/2017 | Liu | H04L 12/18 |
| 9,817,711 B2 * | 11/2017 | Sugahara | G06F 11/1044 |
| 2003/0227397 A1 * | 12/2003 | Cideciyan | G11B 20/1426 |
| | | | 341/58 |
| 2005/0114727 A1 * | 5/2005 | Corbett | G06F 11/1076 |
| | | | 714/6.21 |
| 2008/0109616 A1 * | 5/2008 | Taylor | G06F 3/0611 |
| | | | 711/155 |
| 2008/0222490 A1 * | 9/2008 | Leung | G06F 11/1068 |
| | | | 714/763 |
| 2011/0075576 A1 * | 3/2011 | Patil | H04N 17/00 |
| | | | 370/252 |
| 2014/0380131 A1 * | 12/2014 | Ferguson | H04L 1/001 |
| | | | 714/776 |

* cited by examiner

COMMUNICATION ENDPOINTS AND RELATED METHODS FOR FORWARD ERROR CORRECTION OF PACKETIZED DATA

FIELD

Embodiments of the disclosure relate generally to telecommunications and more specifically to forward error correction, and even more particularly to communication endpoints and related methods for employing forward error correction in a communication environment for audibly impaired users.

BACKGROUND

The data communication industry (e.g., video, audio, text) has progressively provided for higher and higher resolution video. For example, high-definition video (e.g., 720p, 1080i, 1080p, 4k UHD, 8k UHD, etc.) is now standard in many common electronic video devices. Video communication endpoints, televisions, computers, cameras, smartphones, tablets, and many other video electronic devices commonly include high-definition video capture, processing, and/or display capabilities.

Of course, constructing higher-resolution video images requires more video data to generate the video images than lower-resolution video images. As a result, a relatively large amount of video data is often transmitted to and from video electronic devices through data networks (e.g., the Internet, wireless data networks, etc.) During transmission of packetized video data over such data networks, data packets may be lost (i.e., not delivered to the receiving endpoint). Accordingly, video image frames corresponding to lost data packets may be distorted, and in some cases unusable. These distortions due to lost data packets may also affect subsequent video image frames where video compression is used to decrease the amount of video data communicated over the data network.

BRIEF SUMMARY

In some embodiments, disclosed is a communication endpoint including control circuitry including a packetizer configured to segment near-end data packets into groups of data packets. The control circuitry also includes a forward error correction (FEC) packet generator configured to generate row FEC packets and diagonal FEC packets. Each of the row FEC packets includes a row FEC parity of the group of data packets associated therewith. Each of the diagonal FEC packets includes a diagonal FEC parity of the group of data packets associated therewith. The communication endpoint also includes one or more communication elements operably coupled to the control circuitry and configured to transmit the groups of data packets, the row FEC packets, and the diagonal FEC packets through one or more data networks to a far-end communication endpoint.

In some embodiments, disclosed is a method of transmitting packetized data through one or more networks. The method comprises segmenting near-end data into data packets of data units, and indexing groups of the data packets into an ordered set of data packets including one of the data packets in each column of the ordered set of data packets. The method also includes generating a row forward error correction (FEC) packet corresponding to each of the groups of the data packets. The row FEC packet includes row FEC units computed to be a row parity of each of the data packets in a different row of the ordered set of data packets. The method further includes generating one or more diagonal FEC packets corresponding to each of the groups of the data packets. The one or more diagonal FEC packets include diagonal FEC units computed to be a diagonal parity of each of the data packets in a different diagonal of the ordered set of data packets. The method also includes transmitting the groups of the data packets and the corresponding row FEC packets and one or more diagonal FEC packets through one or more networks to a far-end communication endpoint.

In some embodiments, disclosed is a communication endpoint comprising one or more communication elements configured to receive, through one or more data communication networks, a group of far-end data packets, a far-end row forward error correction (FEC) packet corresponding to the group of far-end data packets, and at least one far-end diagonal FEC packet corresponding to the group of far-end data packets. The communication endpoint also includes control circuitry operably coupled to the one or more communication elements and including an FEC repairer configured to use the far-end row FEC packet and at least one far-end diagonal FEC packet to repair missing far-end data packets of the group of far-end data packets. The control circuitry also includes an assembler configured to assemble the far-end data packets into far-end packetized data.

In some embodiments, disclosed is a method of repairing packetized data. The method includes receiving a group of data packets and corresponding forward error correction (FEC) packets through one or more data communication networks. The corresponding FEC packets include a row FEC packet and at least one diagonal FEC packet. The method also includes determining a number of data packets that are missing from the received group of data packets, and using at least one of the corresponding FEC packets to repair the group of data packets responsive to a determination that the number of data packets that are missing from the received group is at least one and less than or equal to a number of the corresponding FEC packets.

In some embodiments, disclosed is a video endpoint including one or more communication elements configured to transmit packetized near-end video data to and receive packetized far-end video data from a far-end video endpoint to enable an audibly impaired user to communicate using non-verbal communications with a far-end user of the far-end video endpoint. The video endpoint also includes a video camera configured to capture near-end video images of the audibly impaired user and provide uncompressed near-end video data corresponding thereto. The video endpoint further includes control circuitry including an encoder configured to compress the uncompressed near-end video data into near-end video data, and a packetizer configured to segment the near-end video data into groups of near-end video data packets. The control circuitry also includes a forward error correction (FEC) packet generator configured to generate a near-end row FEC packet and a near-end diagonal FEC packet for each of the groups of near-end video data packets. The near-end row FEC packet includes a number of near-end row FEC units that is equal to a number of near-end video data units in a longest packet of the near-end video data packets. The near-end row FEC packet includes a row FEC parity of the near-end video data packets in the corresponding group of near-end video data packets. The near-end diagonal FEC packet includes a number of near-end diagonal FEC units that is equal to the number of the near-end video data units in a longest packet of the near-end video data packets in the corresponding group of near-end video data packets plus one less than a number of the near-end video data packets in the corresponding group. The packetized near-end video data includes the groups of near-end video data packets and their corresponding row FEC packets and diagonal FEC packets. The near-end diagonal FEC packet includes a diagonal FEC parity of the near-end video data packets in the corresponding group of near-end video data packets. The control circuitry also includes an FEC repairer configured to use far-end row FEC packets and far-end diagonal FEC packets from the packetized far-end video data to repair corresponding groups of far-end video data packets from the packetized far-end video data. The control circuitry further includes an assembler configured to assemble the repaired far-end video data packets into compressed far-end video data, and a decoder configured to decompress the compressed far-end video data into far-end video data. The video endpoint additionally includes an electronic display configured to display video corresponding to the far-end video data from the decoder.

In some embodiments, disclosed is a communication endpoint comprising means for segmenting near-end data into groups of data packets, means for generating row forward error correction (FEC) packets, each of the row FEC packets associated with a different group of the data packets, and each of the row FEC packets comprising a row FEC parity of the group of data packets associated therewith, means for generating diagonal FEC packets, each of the diagonal FEC packets associated with a different group of the data packets, and each of the diagonal FEC packets comprising a diagonal FEC parity of the group of data packets associated therewith and means for transmitting the groups of data packets, the row FEC packets, and the diagonal FEC packets to a far-end communication endpoint.

BRIEF DESCRIPTION OF THE SEVERAL VIEWS OF THE DRAWINGS

FIG. 7A is a flowchart illustrating the method for repairing the group of far-end data packets using dual-parity FEC. FIGS. 7B through 7L illustrate a portion of packetized far-end data packets received by the communication endpoint of FIGS. 1 and 2 from a far-end communication endpoint of FIG. 1;

FIG. 8A is a flowchart illustrating the method for repairing the group of data packets using triple-parity FEC. FIGS. 8B through 8K illustrate a portion of packetized far-end data packets received by the communication endpoint of FIGS. 1 and 2 from the far-end communication endpoint of FIG. 1;

DETAILED DESCRIPTION

Figure 1:
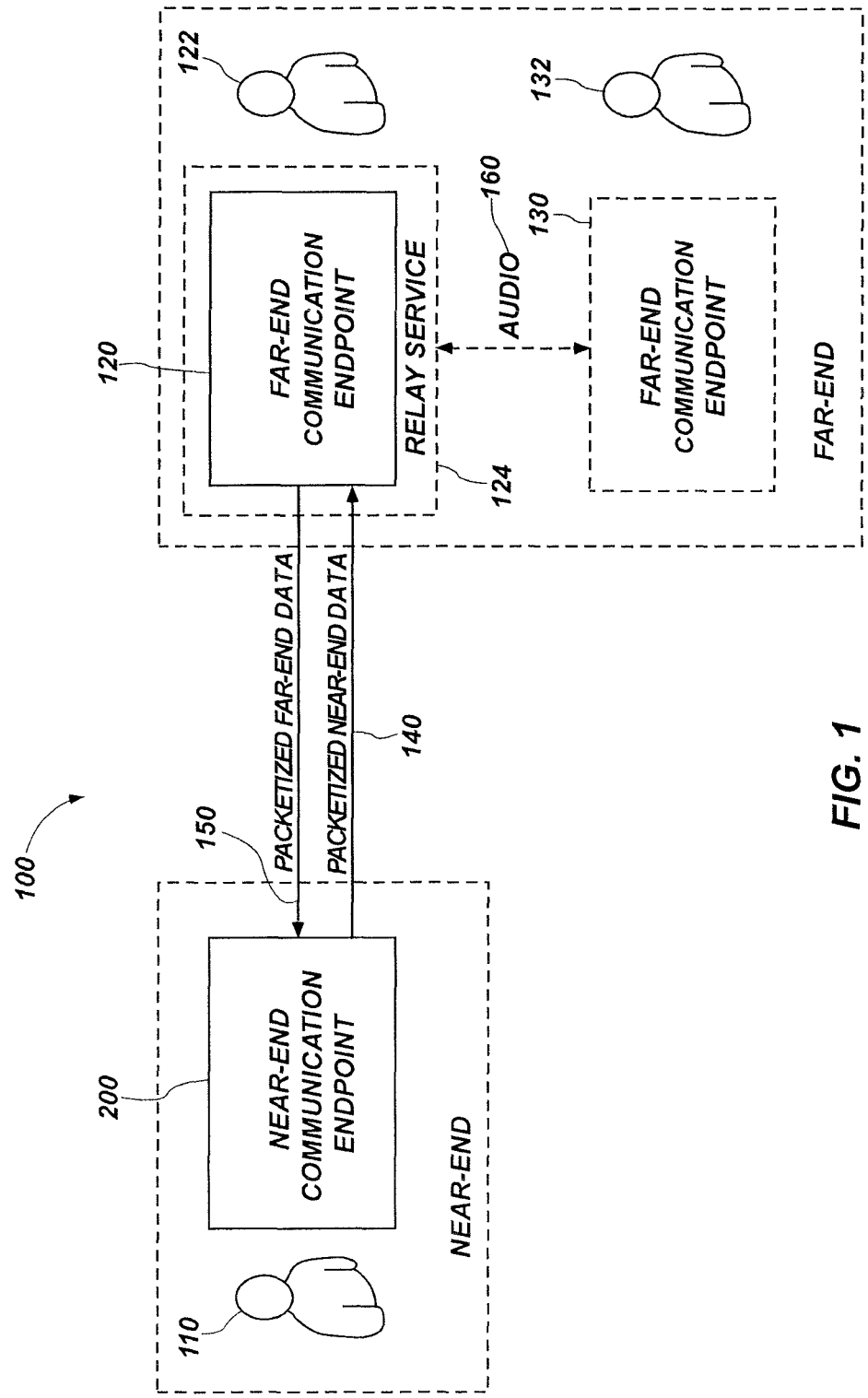
FIG. 1 is a simplified block diagram of a communication system for audibly impaired users.

In the following detailed description, reference is made to the accompanying drawings which form a part hereof, and in which is shown by way of illustration, specific embodiments in which the disclosure may be practiced. These embodiments are described in sufficient detail to enable those of ordinary skill in the art to practice the disclosure. It should be understood, however, that the detailed description and the specific examples, while indicating examples of embodiments of the disclosure, are given by way of illustration only and not by way of limitation. From this disclosure, various substitutions, modifications, additions rearrangements, or combinations thereof within the scope of the disclosure may be made and will become apparent to those of ordinary skill in the art.

In addition, some of the drawings may be simplified for clarity. Thus, the drawings may not depict all of the components of a given apparatus (e.g., device) or method. In addition, like reference numerals may be used to denote like features throughout the specification and figures.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the disclosure may be implemented on any number of data signals including a single data signal.

The various illustrative logical blocks, modules, circuits, and algorithm acts described in connection with embodiments disclosed herein may be implemented or performed with a processor, such as a special-purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein.

The disclosure also provides meaningful limitations in one or more particular technical environments that go beyond an abstract idea. For example, embodiments of the disclosure provide improvements in the technical fields of forward error correction for packet communication, and substantially real-time video communications for audibly impaired users. In addition, embodiments of the disclosure improve the functionality of communication endpoints. In particular, embodiments of the disclosure improve forward error correction of video data communicated through data networks.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions or code on a computer-readable medium. Computer-readable media includes both non-transitory computer storage media and communication media including any medium that facilitates transfer of a computer program from one place to another. For example, control circuitry may include a processor that is configured (e.g., programmed) to execute the instructions as software to implement elements described herein, such as an encoder, packetizing module, FEC generator, FEC repair module, assembler, decoder, etc.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Elements described herein may include multiple instances of the same element. These elements may be generically indicated by a numerical designator (e.g., 100) and specifically indicated by a numeric indicator preceded by a "dash" (e.g., 100-1), or by a numeric indicator proceeded by a letter (e.g., 100A). For ease of following the description, for the most part, element number indicators begin with the number of the drawing on which the elements are introduced or most fully discussed. Thus, for example, element identifiers on a FIG. 1 will be mostly in the numerical format 1xx and elements on a FIG. 4 will be mostly in the numerical format 4xx.

Embodiments of the disclosure include communication endpoints, and related methods for forward error correction (FEC) of packetized network data. It should be noted that while the utility and application of the various embodiments of the disclosure are described with reference to an audibly impaired environment, the disclosure also finds application to any environment where FEC for packetized communication data may be helpful or desirable. In addition, while some of the examples herein may refer specifically to video data, it is contemplated that the FEC may be applied to any type of packetized network data (e.g., video, audio, text, etc.) communicated between at least two endpoints.

As used herein, the term "audibly impaired" refers to people who have at least some audible impairment (e.g., deaf, hard of hearing, and verbally impaired people).

FIG. 1 is a simplified block diagram of a communication system 100 for audibly impaired users. The communication system 100 may include a communication endpoint 200 configured to enable an audibly impaired user 110 at a near-end location to participate in video communication sessions with a far-end user 122 of a far-end communication endpoint 120 located at a far-end location. The terms "near-end" and "far-end" are used herein with reference to the location of the communication endpoint 200. Accordingly, the communication endpoint 200 is located at the near-end. Locations remote to the communication endpoint 200 are, therefore, far-end locations. Of course, it is recognized that "near-end" and "far-end" are relative terms depending on the perspective of the particular user. Thus, the terms "near-end" and "far-end" are used as a convenient way to distinguish between users and devices.

During video communication sessions between the communication endpoint 200 and the far-end communication endpoint 120, the communication endpoint 200 may transmit packetized near-end data 140 (e.g., video data) corresponding to near-end video communications to the far-end communication endpoint 120 (e.g., through one or more data networks, such as, for example, the internet, mobile wireless networks, Wi-Fi networks, cloud networks, local area networks, other networks, and combinations thereof). Also, the communication endpoint 200 may receive packetized far-end data 150 (e.g., video data) corresponding to far-end video communications from the far-end communication endpoint 120. The packetized near-end data 140 and the packetized far-end data 150 may include data corresponding to video images of the audibly impaired user 110 and the far-end user 122, respectively, communicating using gestures. By way of non-limiting example, the gestures may include American Sign Language (ASL) communication.

The packetized near-end data 140 and the packetized far-end data 150 may include groups of data packets and forward error correction (FEC) packets corresponding to each group of data packets. These FEC packets may include a row (i.e., perpendicular) FEC packet and at least one diagonal FEC packet for each group of data packets. Those of ordinary skill in the art will appreciate that data packets (e.g., data packets, FEC packets, etc.) may be lost (e.g., corrupted, damaged, etc.) when communicated over data networks (e.g., the Internet). Accordingly, some of the data packets of the packetized near-end data 140 and the packetized far-end data 150 may be lost during communication sessions between the communication endpoint 200 and the far-end communication endpoint 120. If not repaired, lost data packets may cause distortion in video images displayed by the communication endpoint 200 and the far-end communication endpoint 120 during communication sessions therebetween. The communication endpoint 200 and the far-end communication endpoint 120 may be configured to use the FEC packets to repair lost data packets to avoid such distortion in the video images. More detail regarding how the FEC packets are generated and used to repair lost data packets is discussed below with reference to FIGS. 6 through 8K.

The communication endpoint 200 and the far-end communication endpoint 120 may be configured to capture, process, receive, transmit, and repair data (e.g., video) to enable substantially real-time communications (e.g., video communications) between the audibly impaired user 110 and the far-end user 122. As used herein, the term "substantially real-time communications" refers to providing video to another communication endpoint a short time after the video is captured. A short time may be less than or equal to about a few seconds (e.g., 5 seconds, 3, seconds, 1 second, or less). For example, video images of the audibly impaired user 110 may be considered to be delivered in substantially real time to the far-end communication endpoint 120 if the packetized near-end data 140 delivers the video images to the far-end communication endpoint 120 within a few seconds after the communication endpoint 200 captures the video images.

In some embodiments, the far-end user 122 of the far-end communication endpoint 120 may be another audibly impaired user, or an audibly capable user capable of communicating using gestures (e.g., ASL). In such embodiments, the video communication sessions may be point-to-point communication sessions (e.g., through the Internet, PSTN networks, wireless data networks, combinations thereof, etc.) between the communication endpoint 200 and the far-end communication endpoint 120.

In some embodiments, the far-end user 122 of the far-end communication endpoint 120 may be a call assistant at a relay service 124 (i.e., assistive communication service). Thus, at times the far-end user 122 may also be referred to as the call assistant 122. In these embodiments, the call assistant 122 may provide translation services to enable the audibly impaired user 110 to participate in communication sessions with an audibly capable user 132 of a far-end audio endpoint 130 (e.g., a conventional telephone, cellular phone, VOIP phone, etc.). Although FIG. 1 illustrates both the far-end communication endpoint 120 and the far-end audio endpoint 130 within the same box marked "far-end," the far-end communication endpoint 120 and the far-end audio endpoint 130 may be located at different far-end locations.

The relay service 124 may be configured to convert near-end data packets delivered to the far-end communication endpoint 120 by the packetized near-end data 140 from the communication endpoint 200 into data corresponding to audio communications 160 (hereinafter "audio" 160). For example, the call assistant 122 may speak a voice translation of ASL from the audibly impaired user 110, and generate audio 160 including the voice translation. The relay service 124 may be configured to transmit the audio 160 to the far-end audio endpoint 130 (e.g., through PSTNs, wireless cellular networks, VOIP networks, etc.). The far-end audio endpoint 130 may be configured to convert the audio 160 from the relay service 124 into acoustic waves that may be heard by the audibly capable user 132. The far-end audio endpoint 130 may transmit audio 160 including speech from the audibly capable user 132 to the relay service 124. The call assistant 122 may translate the speech to ASL. The far-end communication endpoint 120 may then transmit the packetized far-end data 150 including video of the call assistant 122 translating the speech to ASL to the communication endpoint 200. The communication endpoint 200 may present the video of the call assistant 122 translating the speech from the audibly capable user 132 into ASL. In this way, the audibly impaired user and the audibly capable user 132 may communicate with each other through the relay service 124.

Figure 2:
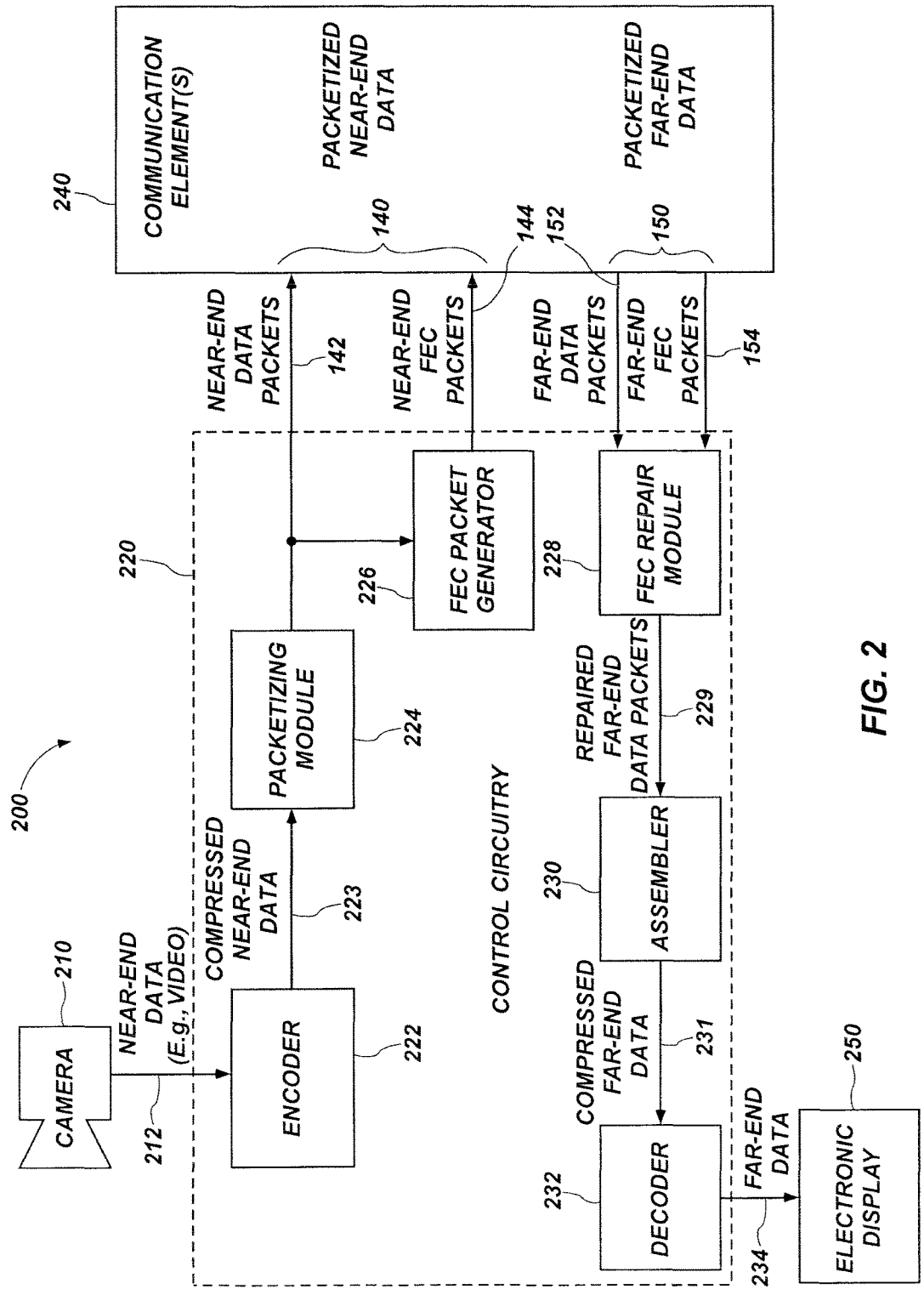
FIG. 2 is a simplified block diagram of a communication endpoint of the communication system of FIG. 1.

FIG. 2 is a simplified block diagram of the communication endpoint 200 of FIG. 1. The communication endpoint 200 may include control circuitry 220 operably coupled to an image capture device 210 (hereinafter "camera" 210, for simplicity), one or more communication elements 240 (hereinafter "communication elements" 240), and an electronic display 250. In some embodiments, the communication endpoint 200 may be a single device including each of the camera 210, the control circuitry 220, the communication elements 240, and the electronic display 250 (e.g., a smartphone, a tablet computer, a desktop computer, a laptop computer, etc., modified with software to perform functions of the communication endpoint 200). In some embodiments, at least one of the camera 210, the control circuitry 220, the communication elements 240, and the electronic display 250 may be implemented in a device separate from others of the camera 210, the control circuitry 220, the communication elements 240, and the electronic display 250 (e.g., a video phone device including the control circuitry 220 and the communication elements 240 operably coupled to an external camera 210 and an external electronic display 250). For example, the camera 210 may be a separate device that is mounted to the electronic display 250 (e.g., television or other monitor), which communicates with a set top box that contains the control circuitry 220 and the communication elements 240.

The camera 210 may be configured to capture video images (e.g., of the audibly impaired user 110 (FIG. 1) communicating using gestures), and provide near-end data 212 corresponding to the video images to the control circuitry 220. The control circuitry 220 may be configured to generate packetized near-end data 140 including groups of near-end data packets 142 and near-end FEC packets 144 corresponding to the groups of near-end data packets 142, and transmit the packetized near-end data 140 to the far-end communication endpoint 120 (FIG. 1) through the communication elements 240 (e.g., modems, wireless communication links, wired communication links, and combinations thereof). In other words, the control circuitry 220 may be configured to packetize and send the near-end data 212 from the camera 210 to the far-end communication endpoint 120 (FIG. 1). The far-end communication endpoint 120 may then use the near-end FEC packets 144 to repair near-end data packets 142 of the packetized near-end data 140 that are lost during the transmission of the packetized near-end data 140.

The control circuitry 220 may include an encoder 222 configured to compress the near-end data 212 into compressed near-end data 223 in order to reduce the amount of data that must be sent through the data networks to the far-end communication endpoint 120 (FIG. 1). By way of non-limiting example, the encoder may be configured to compress the near-end data 212 using video compression protocols known in the art (e.g., H.263, H.264, H.265, etc.).

The control circuitry 220 may also include a packetizing module 224 configured to segment the compressed near-end data 223 into near-end data packets 142 that are small enough to transmit over data networks (e.g., the Internet). By way of non-limiting example, each of the near-end data packets 142 may include a number of data units (e.g., data bytes, bits, words, etc., in a one-dimensional data vector). The packetizing module 224 may also be configured to group the near-end data packets 142 into an ordered set of near-end data packets 142 (e.g., in two-dimensional data vectors of data units). By way of non-limiting example, with video data, each of the groups of near-end data packets 142 may correspond to a separate video frame of near-end video data captured by the camera 210. Also by way of non-limiting example, each of the groups of near-end data packets 142 may correspond to more than one video frame of near-end data 212. As a further non-limiting example, each of the groups of near-end data packets 142 may correspond to one or more portions of video frames of the near-end data 212.

The packetizing module 224 may further be configured to include data packet headers in each of the near-end data packets 142. The data packet headers may include sufficient data to enable the far-end communication endpoint 120 to reconstruct the compressed near-end data 223 with the near-end data packets 142. By way of non-limiting example, the data packet headers may include real-time transport protocol (RTP) headers, each including a marker bit, and data indicating a payload type, a sequence number, an RTP timestamp, and other data.

The control circuitry 220 may also include an FEC packet generator 226. The FEC packet generator 226 may be configured to generate the near-end FEC packets 144 corresponding to the groups of near-end data packets 142 provided by the packetizing module 224. The near-end FEC packets 144 may be configured to enable the far-end communication endpoint 120 to repair near-end data packets 142 lost during transmission that belong to the groups corresponding thereto. The near-end FEC packets 144 may also include indexing information configured to indicate which near-end data packets 142 belong in which groups, and how the near-end data packets 142 were indexed to generate the FEC packets. More detail regarding a method that the FEC packet generator 226 may use to generate the FEC packets 144 is discussed below with reference to FIG. 5.

The control circuitry 220 may also be configured to receive packetized far-end data 150 from the far-end communication endpoint 120 (FIG. 1) through the communication elements 240. The packetized far-end data 150 may include far-end data packets 152 and far-end FEC packets 754. The far-end FEC packets 754 may be configured to enable the control circuitry 220 to repair lost far-end data packets 152.

The control circuitry 220 may further include an FEC repair module 228, an assembler 230, and a decoder 232. The FEC repair module 228 may be configured to receive the far-end data packets 152 and the far-end FEC packets 754, and use the far-end FEC packets 754 to repair any lost far-end data packets 152. The FEC repair module 228 may also be configured to generate repaired far-end data packets 229 including a repaired version of the far-end data packets 152. In instances where none of the far-end data packets 152 is lost, the repaired far-end data packets 229 may be the same as the far-end data packets 152. More detail regarding methods that the FEC repair module 228 may use to generate the repaired far-end data packets 229 is discussed below with reference to FIGS. 6 through 8K.

The assembler 230 may be configured to receive and assemble the repaired far-end data packets 229 into compressed far-end data 231. For example, the repaired far-end data packets 229 may include data packet headers, similar to the near-end data packets 142. The data packet headers may provide the assembler 230 sufficient information to generate the compressed far-end data 231 from the repaired far-end data packets 229. In other words, the assembler 230 may be configured to de-packetize the repaired far-end data packets 229.

The decoder 232 may be configured to receive and decompress the compressed far-end data 231. By way of non-limiting example, the decoder 232 may be configured to decompress the compressed far-end data 231. The decoder 232 may be configured to provide far-end data 234 corresponding to the compressed far-end data 231 to the electronic display 250.

The electronic display 250 may be configured to receive the far-end data 234 from the decoder 232, and display images corresponding to the far-end data 234. The electronic display 250 may include any of a liquid crystal display, a plasma display, a cathode ray tube, a projector display, and other electronic displays known in the art.

It should be understood that, in some embodiments, the far-end communication endpoint 120 of FIG. 1 may similarly be described by the simplified block diagram of FIG. 2. In such embodiments, the compressed near-end data 223 of the communication endpoint 200 should be the same as the compressed far-end data 231 of the far-end communication endpoint 120. Likewise, the compressed near-end data 223 of the far-end communication endpoint 120 should be the same as the compressed far-end data 231 of the communication endpoint 200.

Figure 3:
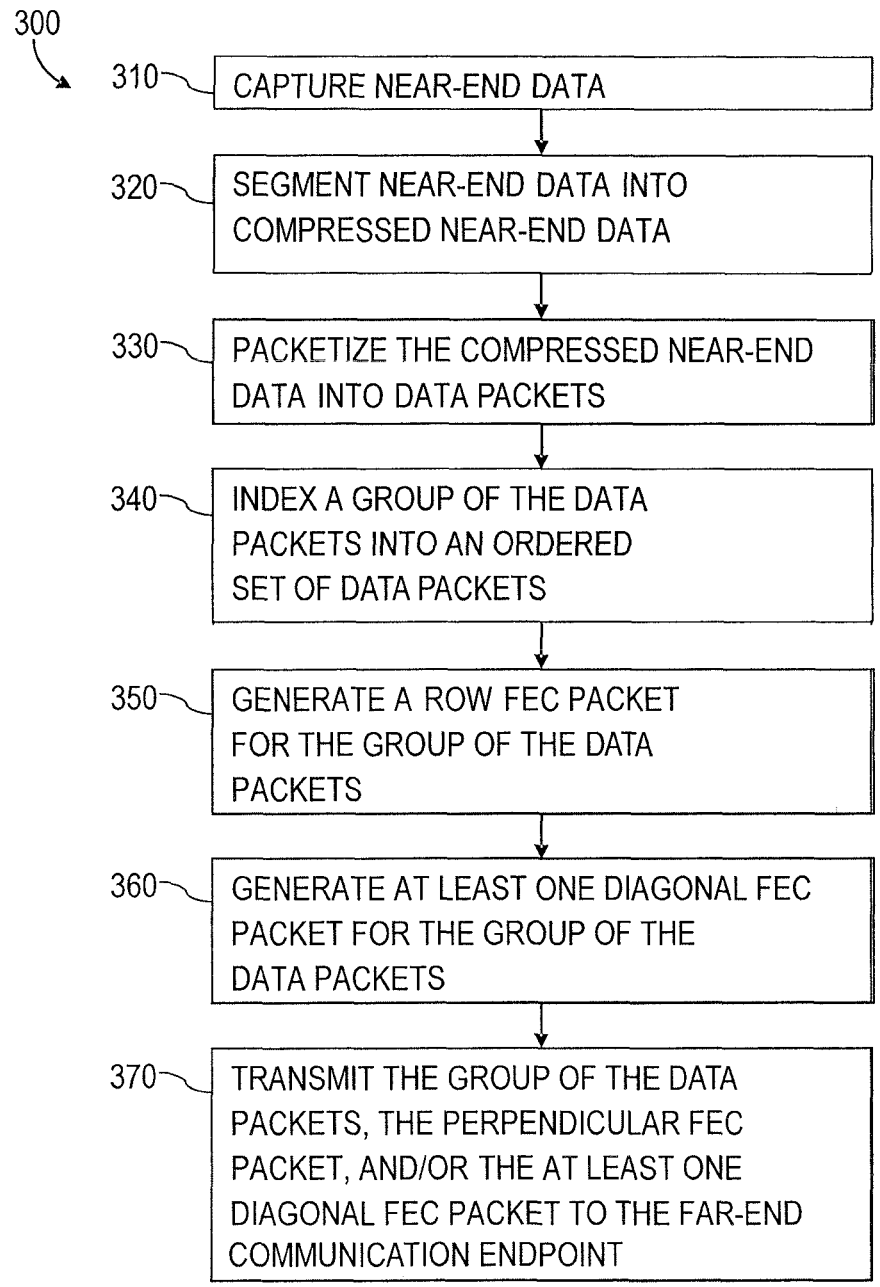
FIG. 3 is a flowchart illustrating a method of operating the communication endpoint of FIGS. 1 and 2.

FIG. 3 is a flowchart 300 illustrating a method of operating the communication endpoint 200. Referring to FIGS. 2 and 3 together, at operation 310, the method may include capturing near-end data 212.

At operation 320, the method may include compressing the near-end data 212 into compressed near-end data 223. At operation 330, the method may include packetizing the compressed near-end data 223 into data packets 142. Packetizing the compressed near-end data 223 into data packets 142 may include dividing data corresponding to the compressed near-end data 223 into the data packets 142. Packetizing the compressed near-end data 223 into data packets 142 may also include generating data packet headers for each of the data packets 142.

At operation 340, the method may include indexing a group of the data packets 142 into an ordered set of data packets. The ordered set of data packets may include a different one of the data packets 142 in each column of the ordered set of data packets. In some embodiments, the entirety of each data packet 142 (e.g., including real-time transport protocol (RTP) headers, etc.) may be included in the ordered set of data packets, and may, therefore, be protected using FEC. Accordingly, the far-end communication endpoint 120 (FIG. 1) may fully reconstruct any missing data packets 142 at the far-end, including marker bit, payload type, sequence number, RTP timestamp, and any other data included in the RTP header. Indexing a group of the data packets 142 into the ordered set of data packets may include monitoring the communication link between the communication endpoint 200 and the far-end communication endpoint 120 (FIG. 1) (e.g., by monitoring the communication link directly, by receiving feedback from the far-end communication endpoint 120 regarding communications received thereby, etc.), and selecting the number of data packets 142 in the group based at least in part on an expected (e.g., detected, predicted, etc.) packet loss rate. For example, if a relatively high packet loss rate is expected, a relatively small number of data packets 142 may be included in the group. Also, if a relatively low packet loss rate is detected, a relatively large number of data packets 142 may be included in the group. Thus, the number of FEC packets, including the row FEC packets and the diagonal FEC packets, that are generated for each group of data packets may be adjusted based, at least in part, on an expected number of data packets expected to be lost during transmission of the groups of data packets to the far-end communication endpoint.

In some embodiments, not all of the data packets 142 may be of the same length. In such instances, the columns of data within the ordered set of data packets may include padding (e.g., with zeros). This padding may be placed at the end of data packets 142 that are shorter than the longest data packet 142 of the group to provide that all the data packets 142 have the same length.

At operation 350, the method may include generating a row FEC packet 444A (FIG. 4) for the group of the data packets 142. Generating a row FEC packet 444A for the group of the data packets 142 may include computing a row parity for the group of the data packets 142. More detail regarding how the row FEC packet 444A may be generated is discussed below with reference to FIGS. 4 and 5.

Generating a row FEC packet 444A may also include generating the row FEC packet 444A including an FEC header. By way of non-limiting example, the FEC header may include a 64-bit FEC header. The FEC header may be configured to indicate, among other things, a minimum sequence number of the data packets 142 protected by the row FEC packet 444A, a type of FEC packet (e.g., row, diagonal, other diagonal, etc.), and which data packets 142 are protected sequentially from and including the base sequence number.

At operation 360, the method may include generating at least one diagonal FEC packet 444B (FIG. 4) for the group of the data packets 142. Generating the diagonal FEC packet 444B for the group of the data packets 142 may include computing a diagonal parity for the group of the data packets 142. More detail regarding how the diagonal FEC packet 444B may be generated is discussed below with reference to FIGS. 4 and 5.

Generating a diagonal FEC packet 444B may also include generating the diagonal FEC packet 444B including an FEC header. Similar to the row FEC header, the diagonal FEC header may be configured to indicate, among other things, a minimum sequence number of the data packets 142 protected by the diagonal FEC packet 444B, the type of FEC packet (e.g., row, diagonal, other diagonal, etc.), and which data packets 142 are protected sequentially from and including the base sequence number.

In some embodiments, generating a diagonal FEC packet 444B may include generating another diagonal FEC packet 144 in addition to the diagonal FEC packet 444B. For example the other diagonal FEC packet 144 may be computed as a diagonal parity of the group of data packets 142 taken along a different diagonal direction than the diagonal parity of the diagonal FEC packet 444B. The other diagonal FEC packet 144 may include an FEC header, similar to the row FEC packet 444A and the diagonal FEC packet 444B.

At operation 370, the method may include transmitting the group of the data packets 142, the row FEC packet 444A, and/or the at least one diagonal data packet 444A to the far-end communication endpoint 120 (FIG. 1). As will be discussed further below, the number of FEC packets, including the number of diagonal FEC packets may depend on a predicted number of missing data packets. As a result, at times row FEC repair may be sufficient for situations of low loss, whereas situations of high loss may use one or more diagonal FEC packets depending on the amount of predicted loss.

In some embodiments, an RTP channel dedicated to transmitting FEC packets 144 may be established in parallel to a channel used for transmitting data packets 142. The FEC packets 144 may be transmitted over the RTP channel dedicated to transmitting the FEC packets 144 as they are generated. It should be noted that a maximum size of FEC packets 144 and data packets 142 may need to be double-checked because once FEC headers are added to the FEC packets 144, and RTP headers are added to the data packets 142, the length of the FEC packets 144 or the data packets 142 may need to be reduced to avoid fragmentation.

Figure 4:
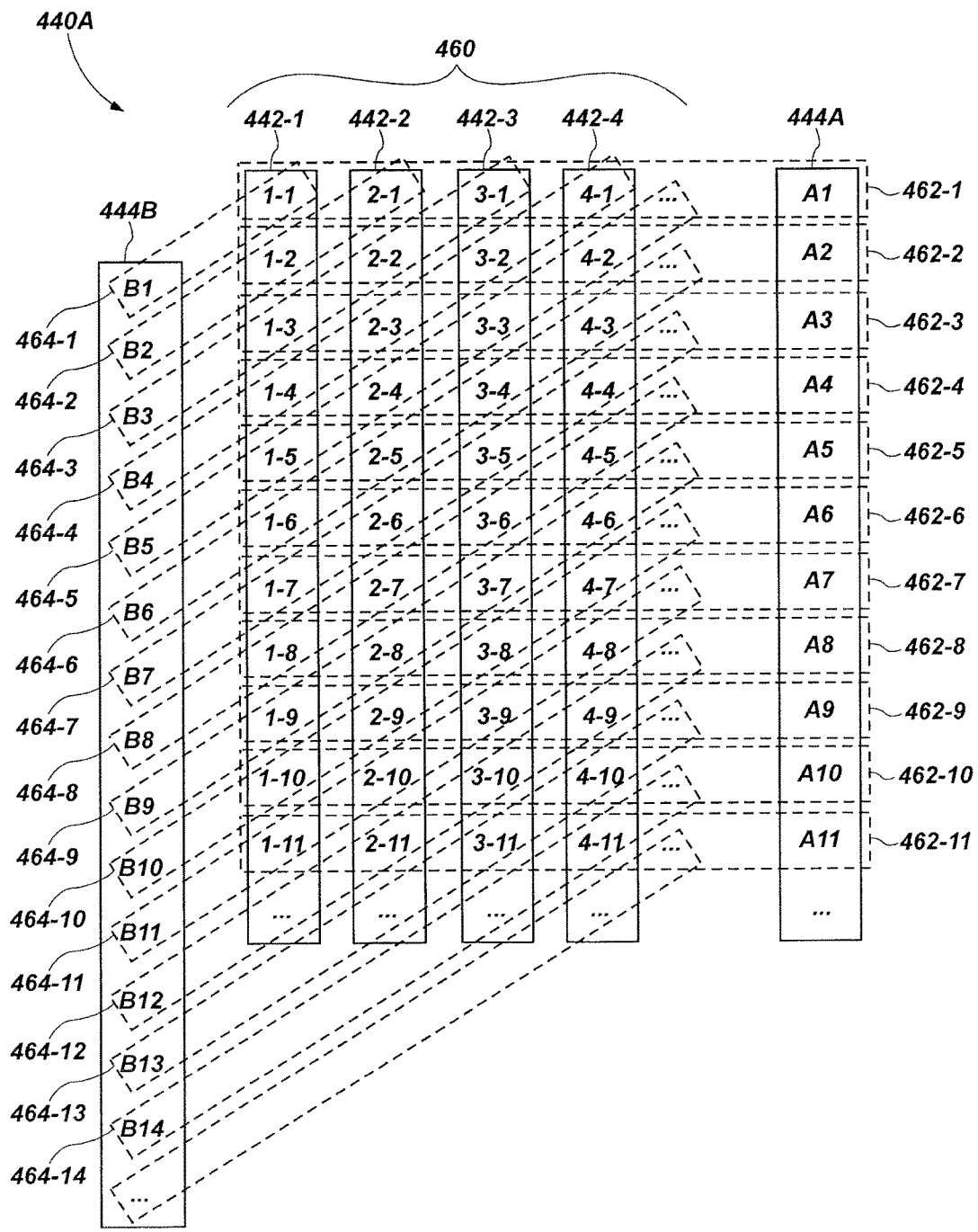
FIG. 4 is a view of a portion of near-end data packets of FIGS. 1 and 2.

FIG. 4 is a view of a portion 440A of the packetized near-end data 440 including data packets and corresponding FEC data packets. As illustrated in FIG. 4, the portion 440A may include a group 460 of data packets 442-1, 442-2, 442-3, 442-4, etc. (hereinafter referred to together as "data packets" 442), logically (e.g., sequentially) arranged in a ordered set of data packets (e.g., two-dimensional vector). For example, in a two-dimensional vector each of the data packets 442 may occupy a different column of the two-dimensional vector. Each of the data packets 442 may include a plurality of data units (e.g., the first data packet 442-1 may include data units 1-1, 1-2, 1-3, and so on, and the second data packet 442-2 may include data units 2-1, 2-2, 2-3, and so on, etc.). Each of the data units may include a unit of packetized data. By way of non-limiting example, the units of data may include bits, bytes, words, or other data units known in the art. As a specific non-limiting example, each of the data units may include 4 bytes, 8 bytes, or another number of bytes as desired.

Figure 5:
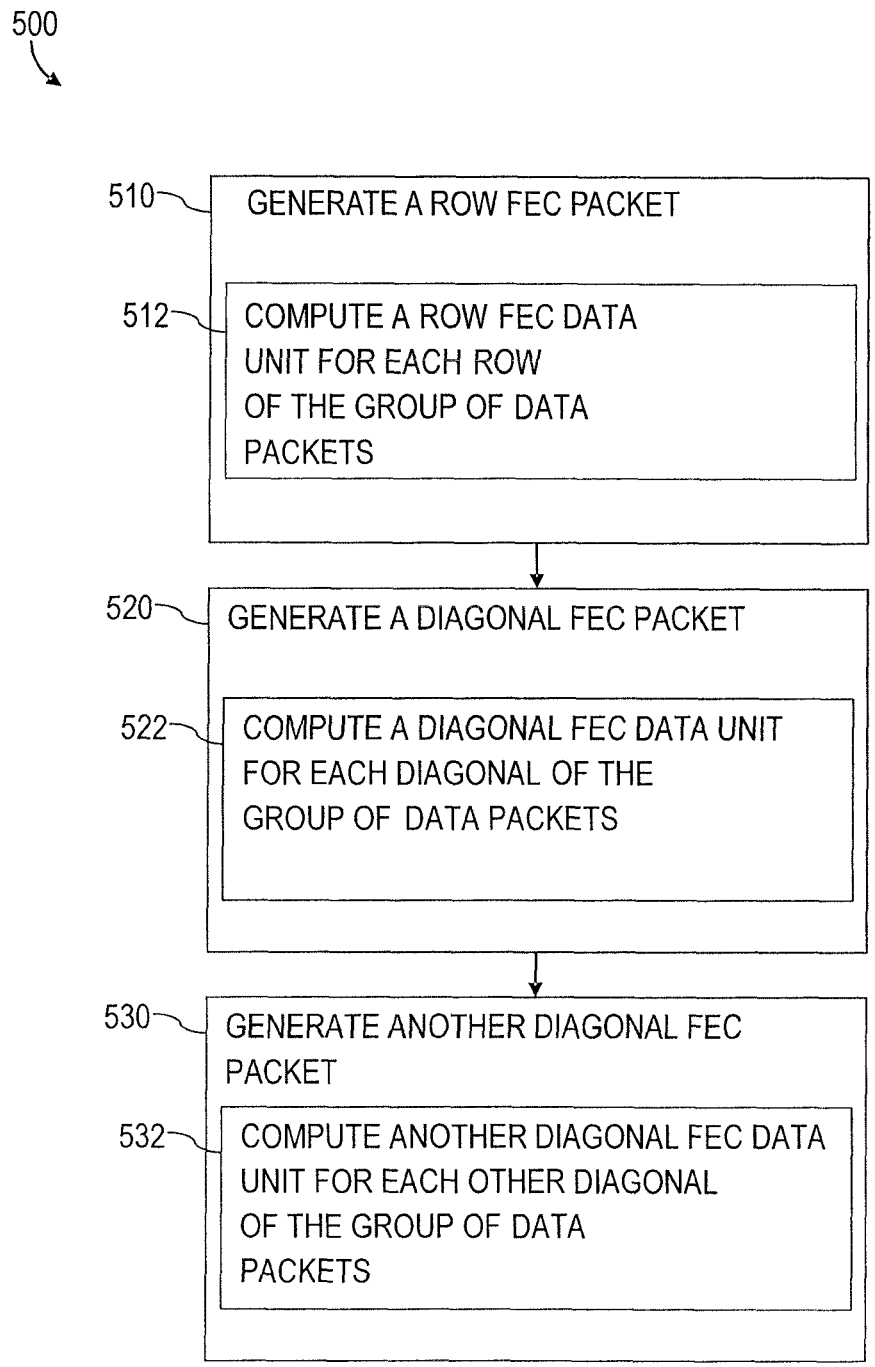
FIG. 5 is a flowchart illustrating an exemplary method that an FEC packet generator of the communication endpoint of FIG. 2 may use to generate near-end FEC packets.

Although the data packets 442 of FIG. 5 are illustrated as occupying vertical columns, in some embodiments the data packets 442 may instead occupy horizontal rows. Also, it should be understood that the portion 440A is merely a visual illustration of contemplated indexing that the control circuitry 220 (FIG. 2) may use to organize the data packets 442 logically into the ordered set of data packets, and may not actually be associated with actual vertical or horizontal directions. Accordingly, as used herein, the terms "column" may be conceptual columns corresponding to indexed organizations of the data units in the data packets 442. Furthermore, as used herein, directional terms such as "perpendicular," "vertical," "horizontal," and "diagonal," although useful with reference to discussing the portion 440A, may merely be used herein for simplicity in discussing indexed data units in an ordered data set.

The portion 440A may also include a row FEC packet 444A and at least one diagonal FEC packet 444B (hereinafter referred to herein together as "FEC packets" 444). The row FEC packet 444A and the diagonal FEC packet 444B may each be one-dimensional vectors. As used herein, the terms "row" and "diagonal," when used with reference to FEC packets 444, implies that the FEC packets were generated using a parity that is oriented as a row and diagonally, respectively, as compared to a direction of the data packets 442. In other words, if the data packets 442 are oriented vertically (as in FIG. 4), the row FEC packet 444 may be generated as a horizontal parity of the group of data packets 442. For example, the row FEC packet 444A may include row FEC data units A1, A2, A3, etc., generated from data units (e.g., XORing) horizontally across a single row. Similarly, the diagonal FEC packet 444B may include diagonal FEC data units B1, B2, B3, etc., that are generated from data units (e.g., XORing) diagonal across multiple rows. In some embodiments, the diagonal direction may slope upward (i.e., a positive slope) as shown in FIG. 4. In other embodiments the diagonal direction used may slope downward (i.e., a negative slope). In some embodiments, diagonal FEC packets may be generated in both the upward as well as the downward directions. For example, the first diagonal FEC packet 444B may be generated using data units in the positive sloped direction, while a second diagonal FEC packet (not shown in FIG. 4) may be generated using data units in the negative sloped direction. The second diagonal FEC packet is shown in further detail in FIGS. 8B-8K with respect to the repair process.

FIG. 5 is a flowchart 500 illustrating an example method that the FEC packet generator 226 may use to generate the FEC packets 144 of FIGS. 2 and 4. Referring to FIGS. 4 and 5 together, at operation 510, the method may include generating the row FEC packet 444A Generating the row FEC packet 444A may include, at operation 512, computing a row FEC data unit A1, A2, A3, etc., for each row 462-1, 462-2, 462-3, etc. (hereinafter referred to generically together as "rows" 462 and individually as "row" 462), of the group 460 of data packets 442. Each row FEC data unit A1, A2, A3, etc., may be a row parity of each of the data units 1-1, 1-2, . . . , 2-1, 2-2, . . . 3-1, 3-2, . . . , 4-1, 4-2, . . . from the row 462 that corresponds thereto. In other words, each of the row FEC data units A1, A2, A3, . . . may be computed to be a function of each of the data units 1-1, 1-2, . . . , 2-1, 2-2, . . . 3-1, 3-2, . . . , 4-1, 4-2, . . . from the row 462 that corresponds thereto. For example, the row data unit A1 may be a function of each of the data units 1-1, 2-1, 3-1, 4-1, . . . in row 462-1 (i.e., A1=$f_A$(1-1, 2-1, 3-1, 4-1, . . . )). Also, the row data unit A2 may be a function of each of the data units 1-2, 2-2, 3-2, 4-2, . . . in row 462-2 (i.e., A2=$f_A$(1-2, 2-2, 3-2, 4-2, . . . )).

At operation 520, the method may include generating a diagonal FEC packet 444B. Generating the diagonal FEC packet 444B may include, at operation 522, computing a diagonal FEC data unit B1, B2, B3, etc., for each diagonal 464-1, 464-2, 464-3, . . . (sometimes referred to herein generically together as "diagonals" 464 and individually as "diagonal" 464) of the group 460 of data packets 442. Each diagonal FEC data unit B1, B2, B3, . . . may be a diagonal parity of each of the video data units 1-1, 1-2, . . . , 2-1, 2-2, . . . 3-1, 3-2, . . . , 4-1, 4-2, . . . from the diagonal 464 that corresponds thereto. In other words, each of the diagonal FEC data units B1, B2, B3, . . . may be computed to be a function of each of the data units 1-1, 1-2, . . . , 2-1, 2-2, . . . 3-1, 3-2, . . . , 4-1, 4-2, . . . from the diagonal 464 that corresponds thereto. For example, the diagonal data unit B1 may be a function of the data unit 1-1 in diagonal 464-1 (i.e., B1=$f_B$(1-1)). Also, the diagonal data unit B2 may be a function of each of the data units 1-2, 2-1 in diagonal 464-2 (i.e., B2=$f_B$(1-2, 2-1)). Similarly, the diagonal data unit B3 may be a function of each of the data units 1-3, 2-2, 3-1, and so on for other diagonals.

Any of a variety of different functions $f_A$, $f_B$ may be used to compute the row FEC data units A1, A2, A3, . . . and the diagonal FEC data units B1, B2, B3, . . . from the data units in the data packets 442. By way of non-limiting examples, any of an XOR function, an addition function, a multiplication function, and any other function may be used. In some embodiments, the same function may be used to compute each of the row FEC data units A1, A2, A3, . . . and each of the diagonal FEC data units B1, B2, B3, . . . . In some embodiments, a different function may be used to compute the row FEC data units A1, A2, A3, . . . than a function that is used to compute the diagonal FEC data units B1, B2, B3, . . . . In some embodiments, different functions may be used to compute some of the row FEC data units A1, A2, A3, . . . than are used to compute others of the row FEC data units A1, A2, A3, . . . . In some embodiments, different functions may be used to compute some of the diagonal FEC data units B1, B2, B3, . . . than are used to compute others of the diagonal FEC data units B1, B2, B3, . . . .

Similar to the data units, the row FEC data units A1, A2, A3, . . . and the diagonal FEC data units B1, B2, B3, . . . may each include a unit of data. By way of non-limiting example, the unit of data may include a bit, a byte, a word, or other data unit. In addition, it is also noted that protected data may belong to multiple protected data sets.

In some embodiments, at operation 530, the method may include generating a second diagonal FEC packet (not shown) as discussed above. The second diagonal FEC packet may be generated similarly to the diagonal FEC packet 444B except that diagonals corresponding to other diagonal FEC data units of the other diagonal FEC packet may be taken in a different direction across the group 460 than the diagonals 464 corresponding to the diagonal FEC packet 444B. By way of non-limiting example, data units 1-1, 2-2, 3-3, 4-4, . . . may be used to compute one of the other diagonal data units of the other diagonal FEC packet. Accordingly, at operation 532, the method may include computing another diagonal FEC data unit for each other diagonal of the group 460 of data packets 442.

As will be apparent from an observation of the portion 440A of FIG. 4, a length of the row FEC packet 444A may be the same as a length of the data packets 442. As will also be apparent from an observation of the portion 440A of FIG. 4, a length of the diagonal FEC packet 444B (and the other diagonal FEC packet, if used) may be equal to the length of the data packets 442 plus one less than the number of data packets 442 in the group 460. As discussed above, not all of the data packets 442 may be of the same length. In such instances, the columns of data within the ordered set of data packets may include padding (e.g., with zeros). This padding may be placed at the end of data packets 442 that are shorter than the longest data packet 442 of the group to provide that all the data packets 442 have the same length. Other lengths are also contemplated.

The choice of whether to use one (i.e., dual parity FEC operation) or two (i.e., triple-parity FEC operation) diagonal FEC packets may depend, at least in part, on the communication link between the communication endpoint 200 (FIGS. 1 and 2) and the far-end communication endpoint 120 (FIG. 1). If it is not expected for more than two data packets 442 of the group 460 to be lost in transmission to the far-end communication endpoint 120, only one diagonal FEC packet may be generated and transmitted to the far-end communication endpoint 120 with the group 460 of data packets 442 and the row FEC packet 444A (i.e., dual-parity FEC operation). This is because the row FEC packet 442 and a single diagonal FEC packet are together sufficient to repair the group 460 of data packets 442 if two or less data packets 442 are lost during transmission. If, however, three data packets 442 are likely to be lost, two diagonal FEC packets 444 may be transmitted. This is because the row FEC packet 444A and two diagonal FEC packets 444 are sufficient to repair the group 460 of data packets 442 if three or less data packets 442 are lost.

The transmission of FEC packets 444, however, occupies some of the available communication bandwidth, and may reduce the number of data packets 442 that may be transmitted per unit time to the far-end communication endpoint 120 if the bandwidth is limited. By way of non-limiting example, if the bandwidth limit is 1 Mbps (megabit per second), and losses suggest that 200 kbps (kilobits per second) of FEC data should be sent, the data rate may be only about 800 kbps.

Accordingly, in some embodiments, the control circuitry 220 may monitor the communication link between the communication endpoint 200 and the far-end communication endpoint 120. In some embodiments, the far-end communication endpoint 120 may monitor the communication link, such as by monitoring a download data rate and a packet loss rate of the group of data packets, the row FEC packet, and the diagonal FEC packet. The far-end communication endpoint 120 may be configured to then transmit channel quality data indicating the download data rate and the packet loss rate to the near-end communication endpoint 200 that generated the group of data packets, the row FEC packet, and the at least one diagonal FEC packet. The communication endpoint 200 may, in response to the channel quality data (whether generated by its own monitoring or received from the far-end), cause the FEC packet generator 226 to only produce the extra diagonal FEC packet 444 if it is determined that three data packets 442 are likely to be lost (i.e., triple-parity FEC operation). Similarly, the control circuitry 220 may cause the FEC packet generator 226 to only produce the row FEC packet 444A, and no diagonal FEC packets 444, if it is determined that only one data packet 442 is likely to be lost (i.e., single-parity FEC operation). Furthermore, the control circuitry 220 may cause the FEC packet generator 226 to not produce any FEC packets if it is determined that no data packets 442 are likely to be lost. Similarly, the segmentation of the data (i.e., the number of packets in a video frame) may be adjusted in consideration of bandwidth. For example, the number of packets in each video frame may be dynamically adapted so that the required FEC coverage is achieved while controlling the bandwidth consumed by FEC. For example, if it is desired that FEC use 25% of the available bandwidth when applying three FEC packets (e.g., a row FEC packet, a first diagonal FEC packet in a first direction, and a second diagonal FEC packet in a second direction), the video frame may be segmented into nine data packets of approximately equal length. In this example, the FEC may include three packets, which may result in a total of twelve packets sent per frame (9 data packets+3 FEC packets) that may result in the FEC taking approximately 25% of the available bandwidth. Of course, other numbers of packets per frame and FEC percentages of the bandwidth are contemplated depending on the needs for the system.

As a non-limiting example, preliminary tests suggest that two FEC packets 444 (e.g., a row FEC packet 444A and a diagonal FEC packet 444B) are sufficient to protect against a 3% network loss when protecting groups of 8 data packets 442. Accordingly, a guideline for determining a number of data packets 442 to be included in a protected group 460 may be computed using 24/PL %, where PL % is the packet loss percentage, and _/_ is the division operator. Also, an example guideline table is shown below that may be used for determining how many FEC packets 444 to use, and a maximum number of protected data packets 442 that should be included in a protected group for single and dual-parity FEC systems for a given a packet loss percentage:

| Packet Loss Percentage | Number of FEC Packets | Maximum Number of Data Packets In Protected Group |
| --- | --- | --- |
| <0.375 | 1 | 32 |
| 0.75 | either 1 or 2 | 16 through 32 |
| 1 | either 1 or 2 | 12 through 24 |
| 2 | either 1 or 2 | 6 through 12 |
| 3 | either 1 or 2 | 4 through 8 |
| 6 | either 1 or 2 | 2 through 4 |
| 8 | 2 | 3 |
| 12 | 2 | 2 |

By way of non-limiting example, with video data, if a video frame is made up of 16 data packets and a communication link between the communication endpoint 200 and the far-end communication endpoint 120 is expected to have a 2% packet loss, the frame may be divided into two groups 460 of protected data packets 442, each protected by a different set of FEC packets 444. For example, each of the two groups 460 may be protected by either one or two FEC packets 444. Of course, two FEC packets 444 for each group of 8 data packets 442 would provide more robust protection than one FEC packet 444 for each group of 8 data packets 442 in case of brief fluctuations in packet loss percentage, or in case of consecutive loss of data packets 442 (single-parity FEC may not repair loss of consecutive data packets 442 because two data packets would likely be lost from the same group of data packets 442).

As a specific, non-limiting example, dual-parity (i.e., row-diagonal parity) may be used to protect a group of only two data packets 442. This is a better solution than transmitting the two protected data packets 442 twice (i.e., redundancy). In such instances, there are four packets transmitted: two data packets 442, and two FEC packets 444. If any two of these are lost, the two data packets may be repaired. If redundancy were instead relied upon, there is a chance that the two lost packets may be the same data packet 152, which could not then be repaired. Dual parity FEC does not suffer from such limitation because no matter which two of the data packets 152 and the FEC packets 754 are lost, the data packets 152 may be repaired. This is likewise true for triple parity repair (e.g., three data packets and 3 FEC packets) discussed below.

In an example using three FEC packets, an example guideline table is shown below that may be used for determining how many FEC packets 444 to use, and a maximum number of protected data packets 442 that should be included in a protected group for triple-parity FEC systems for a given packet loss percentage:

| Packet Loss Percentage | Number of FEC Packets | Maximum Number of Data Packets In Protected Group |
| --- | --- | --- |
| 1 | 3 | 27 (10% FEC) |
| 2 | 3 | 18 (14% FEC) |
| 3 | 3 | 9 (25% FEC) |
| 5 | 3 | 6 (33% FEC) |
| 9 | 3 | 3 (50% FEC) |

Figure 6:
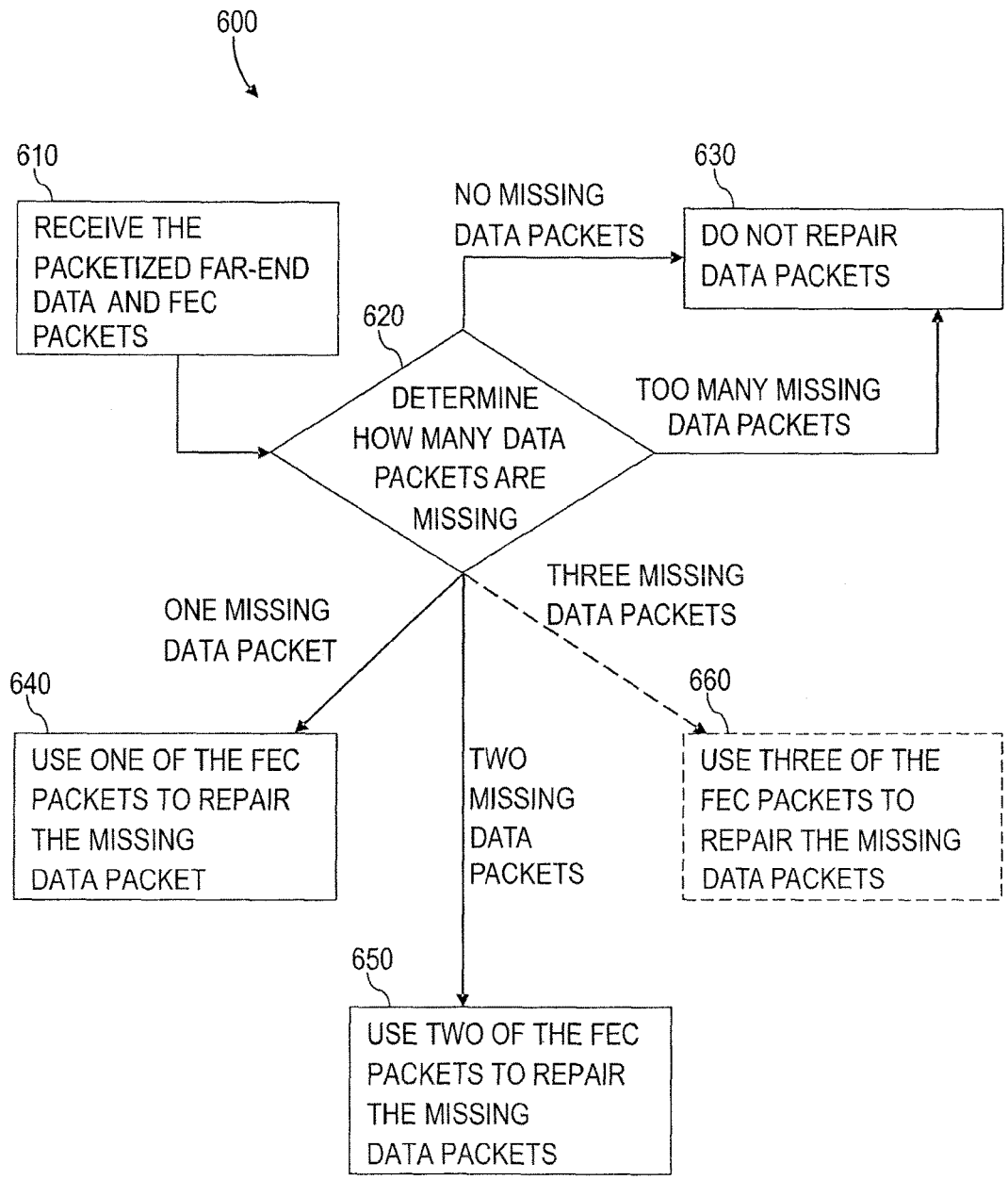
FIG. 6 is a flowchart illustrating a method of repairing far-end data packets of FIGS. 1 and 2.

FIG. 6 is a flowchart 600 illustrating a method of repairing the packetized far-end data 150 of FIG. 2. At operation 610, the method may include receiving the packetized far-end data 150 from a far-end communication endpoint 120 (FIG. 1). Receiving the packetized far-end data 150 may include receiving a group of data packets 152 (FIG. 2), a row FEC packet 154, and at least one diagonal FEC packet 154. In some embodiments, receiving the group of data packets 152, the row FEC packet 154, and the at least one diagonal FEC packet 154 may include receiving the data packets 152 through a separate communication channel from a communication channel the row FEC packet 154 and the at least one diagonal FEC packet 154 are received through. In some embodiments, the group of data packets 152, the row FEC packet 154, and the at least one diagonal FEC packet 154 may be sent and received through the same communication channel.

At operation 620, the method may include determining how many data packets 152 are missing from the group of data packets 152. Determining how many data packets 152 are missing from the group may include accessing indexing data provided by FEC packet headers of the FEC packets 154. By way of non-limiting example, the indexing data provided by the FEC packet headers may include information identifying packet characteristics for use in reassembling video frames from the data packets (e.g., variables such as, for example, RTP timestamp, payload size, marker bit, extended sequence number (accounting for sequence number wrapping)). The indexing data may also indicate how many data packets 152 should be part of the group and how the data packets 152 should be indexed to form a ordered set of data packets (e.g., a two-dimensional unsigned integer array) for FEC operations. Empty data packets 152 may be pushed into the ordered set of data packets ahead of a received data packet 152 if the received data packet 152 is received ahead of other data packets 152 with lower sequence numbers (i.e., out of order). When a data packet 152 is received for which an empty data packet was pushed into the ordered set of data packets, the data may be copied into the appropriate location within the ordered set of data packets. For example, a memory copy (i.e., "memcpy" command) may be used to perform such an operation. In some embodiments, however, the data packets may be sequentially ordered in an array of pointers to the data packets. This "an ordered set of data packets" also refers to an array of pointers to the data packets rather than having a copied array of data packets themselves organized in a particular order. As a result, rather than copying a whole data set into an "empty packet," a pointer to that packet may be written into the array at the proper location.

By way of non-limiting example, the ordered set of data packets may be permitted to maintain 64 packets, providing a buffer within which FEC will be applied. To improve efficiency of the ordered set of data packets, the capacity of the ordered set of data packets may be reserved in a constructor of an RTP data object. If the buffer is full when a new data packet 152 is received, an oldest packet in the vector may be erased, and the new data packet 152 may be pushed into the ordered set of data packets.

Also by way of non-limiting example, an RTP data class may include members to maintain the status of the ordered set of data packets. Initially, the members may include the extended sequence number of the oldest data packet 152 in the ordered set of data packets, a 64 bit integer referenced bitwise to indicate whether a data packet 152 has been received, and a number of packets in the ordered set of data packets. Two data members, a maximum sequence number received and a number of sequence number cycles, may be used to determine the extended sequence number of every incoming packet.

Once the group of data packets 152 is properly organized into the ordered set of data packets, it may be determined how many data packets 152 are missing from the group. When an FEC packet 154 is received, it may be determined whether the FEC packet protects data packets 152 that have a sequence number greater than that yet received. If so, empty data packets 152 may be pushed into the RTP packet vector so that all data packets 152 protected by the FEC packets 154 are represented in the ordered set of data packets. The RTP data object may then be queried again to determine if the FEC packet 154 is needed (i.e., there are data packets 154 missing from the group). If the FEC packet 154 is not needed, (no missing packets), the FEC packet 154 may be discarded. Also, if it is determined that none of the data packets 152 are missing, then at operation 630 the method may end without repairing the group of data packets 152.

Returning to operation 620, if it is determined that one data packet 152 is missing, at operation 640 the method may include using one of the row FEC packet 154 and the at least one diagonal FEC packet 154 to repair the missing data packet 152. The FEC packet 154 that will be used to repair the missing data packet 152 may be stored by the control circuitry 220 in a vector. As previously discussed, the group of data packets 152 may be indexed in a ordered set of data packets. In the case that one of the data packets 152 is missing, the ordered set of data packets may be missing a column of data corresponding to the missing data packet 152.

The FEC repair module 228 may repair the missing data packet by computing (e.g., missing data unit by missing data unit) an inverse function of the function that was used by the far-end communication endpoint 120 (FIG. 1) to generate the FEC packet 154. By way of non-limiting example, if the row FEC packet 154 is used, a different row FEC unit from the row FEC packet 154 may correspond to each missing data element of the missing data packet 152. A first row FEC unit may be used with first data units of each of the other data packets 152 from the group to compute a first missing data unit of the missing data packet 152. Also, a second row FEC unit may be used with second data units of each of the other data packets 152 to compute a second missing data unit of the missing data packet 152. After each data unit has been repaired, the resulting group of data packets 152 may match the group of data packets 152 originally generated by the far-end communication endpoint 120 (FIG. 1).

Returning to operation 620, if it is determined that two data packets 152 are missing, at operation 650 the method may include using two of the row FEC packet 154 and the at least one diagonal FEC packet 154 to repair the missing data packets 152 (i.e., dual-parity FEC). More detail regarding how the FEC repair module 228 may use dual-parity FEC to repair the missing data packets is discussed below with reference to FIGS. 7A through 7L.

In embodiments where the at least one diagonal FEC packet 154 includes two diagonal FEC packets 154, if it is determined at operation 620 that three data packets 152 are missing, at operation 660, the method may include using each of the row FEC packet 154 and the two diagonal FEC packets 154 to repair the missing data packets 152 (i.e., triple-parity). Generating another diagonal FEC packet may be oriented in the opposite direction as shown in the example of FIGS. 7A through 7L. More detail regarding how the FEC repair module 228 may use triple-parity to repair the missing data packets is discussed below with reference to FIGS. 8A through 8K.

Returning once again to operation 620, if it is determined that a number of missing data packets 152 exceeds a number of FEC packets 154 corresponding to the group of data packets 152 (i.e., too many missing data packets 152), at operation 630, the method may end without repairing the group of data packets 152. If the number of missing data packets 152 exceeds the number of FEC packets 154, the missing data packets 152 cannot readily be repaired using FEC. Accordingly, the FEC repair module 228 may not attempt to repair the data packets 152 in such instances.

Figure 7A:
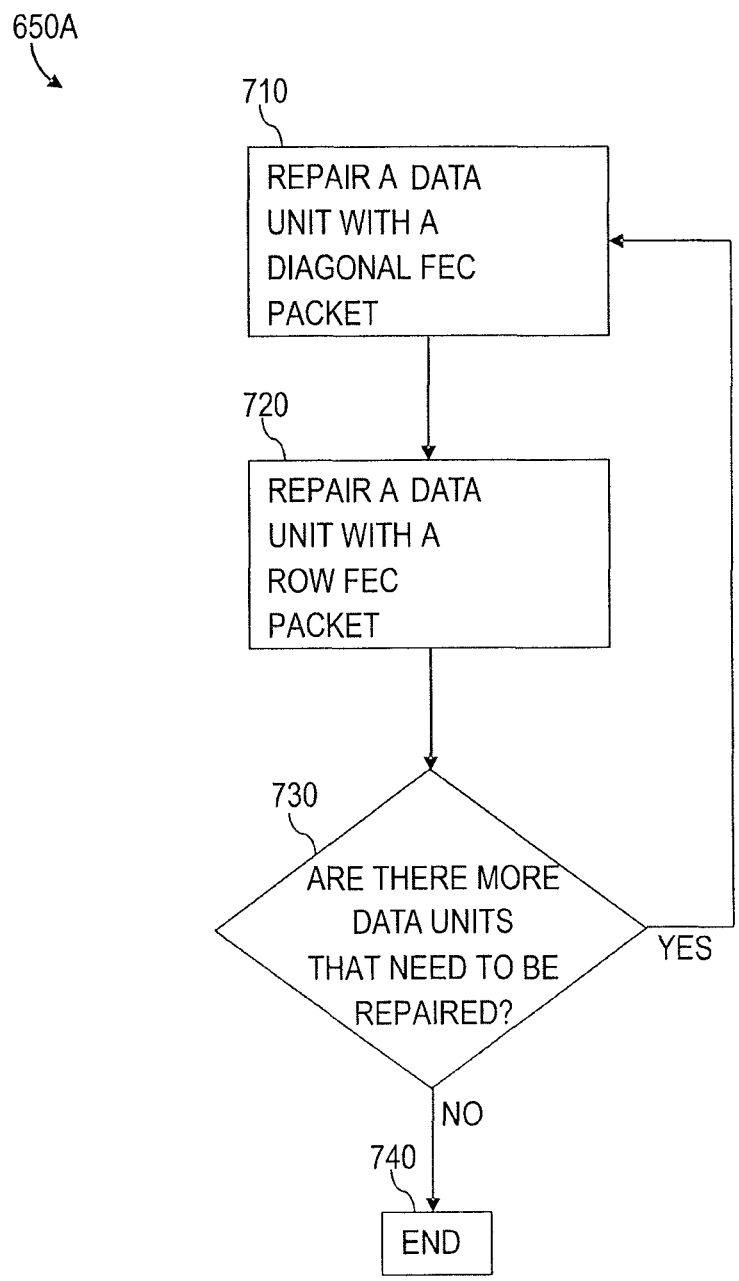
FIGS. 7A through 7L illustrate an exemplary method for repairing a group of far-end data packets using dual-parity forward error correction.
Figure 7B:
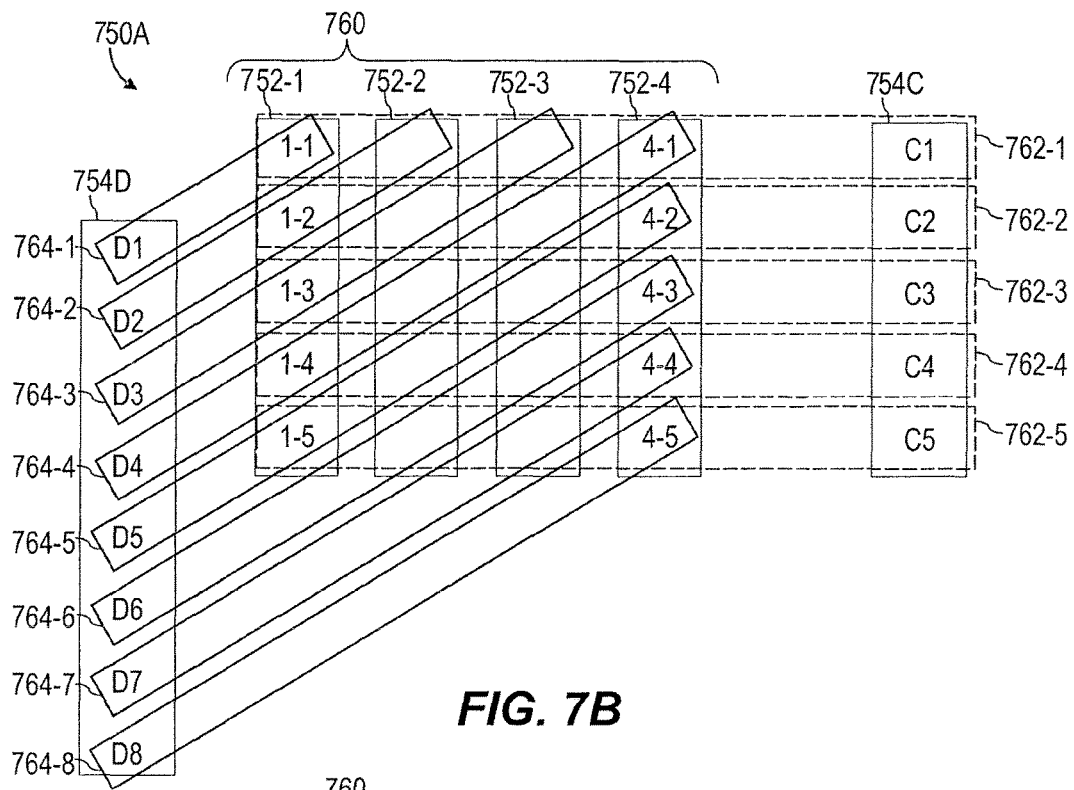

FIGS. 7A through 7L illustrate an example method for repairing a group 760 of data packets 752 using dual-parity FEC. FIG. 7A is a flowchart 700 illustrating the method for repairing the group 760 of data packets 752 using dual-parity FEC. FIGS. 7B through 7L illustrate a portion 750A of packetized far-end data 150 (FIGS. 1 and 2) received by the communication endpoint 200 (FIGS. 1 and 2) from the far-end communication endpoint 120 (FIG. 1). Referring to FIGS. 7A through 7L together, the received packetized far-end data 150 may include the portion 750A. The portion 750A may include a group 760 of far-end data packets 752-1, 752-2, 752-3, 754-4 (sometimes referred to herein generically together as "data packets" 752), a row FEC packet 754C corresponding to the group 760, and a diagonal FEC packet 754D corresponding to the group 760. As illustrated in FIG. 7B, two of the data packets 752-2, 752-3 may have been lost during transmission from the far-end communication endpoint 120.

The row FEC packet 754C may include row FEC units C1, C2, C3, and C4 generated using a row parity of data units 1-1, 1-2, 1-3, . . . 4-4, 4-5 (sometimes referred to herein simply as "data units") by the far-end communication endpoint 120. Specifically, the row FEC units C1, C2, C3, and C4 may have been generated by computing a function $f_C$ of each of the data units in a row 762-1, 762-2, 762-3, and 762-4 of the group 760 that corresponds thereto (i.e., $C1=f_C(1\text{-}1, 2\text{-}1, 3\text{-}1, 4\text{-}1)$, $C2=f_C(1\text{-}2, 2\text{-}2, 3\text{-}2, 4\text{-}2)$, $C3=f_C(1\text{-}3,$ 2-3, 3-3, 4-3), C4=$f_C$(1-4, 2-4, 3-4, 4-4)). By way of non-limiting example, if the function $f_C$ is an addition function, and data units 1-1, 2-1, 3-1, and 4-1 are equal to 5, 2, 7, and 5, respectively, then C1 may be equal to 5+2+7+5=19.

The diagonal FEC packet 754D may include diagonal FEC units D1, D2, D3, . . . generated using a diagonal parity of the of the data units by the far-end communication endpoint 120. Specifically, the diagonal FEC units D1, D2, D3, . . . may have been generated by computing a function $f_D$ of each of the data units in a diagonal 764-1, 764-2, 764-3, . . . of the group 760 that corresponds thereto (i.e., D1=$f_D$(1-1), D2=$f_D$(1-2, 2-1), D3=$f_D$(1-3, 2-2, 3-1), D4=$f_D$(1-4, 2-3, 3-2, 4-1), etc.). By way of non-limiting example, if the function $f_D$ is an addition function, and data unit 1-1 is equal to 5, then D1 may be equal to 5. Also by way of non-limiting example, if the function $f_D$ is the addition function, and data units 1-2 and 2-1 are equal to 3 and 2, respectively, FEC unit D2 may be equal to 3+2=5.

Figure 7C:
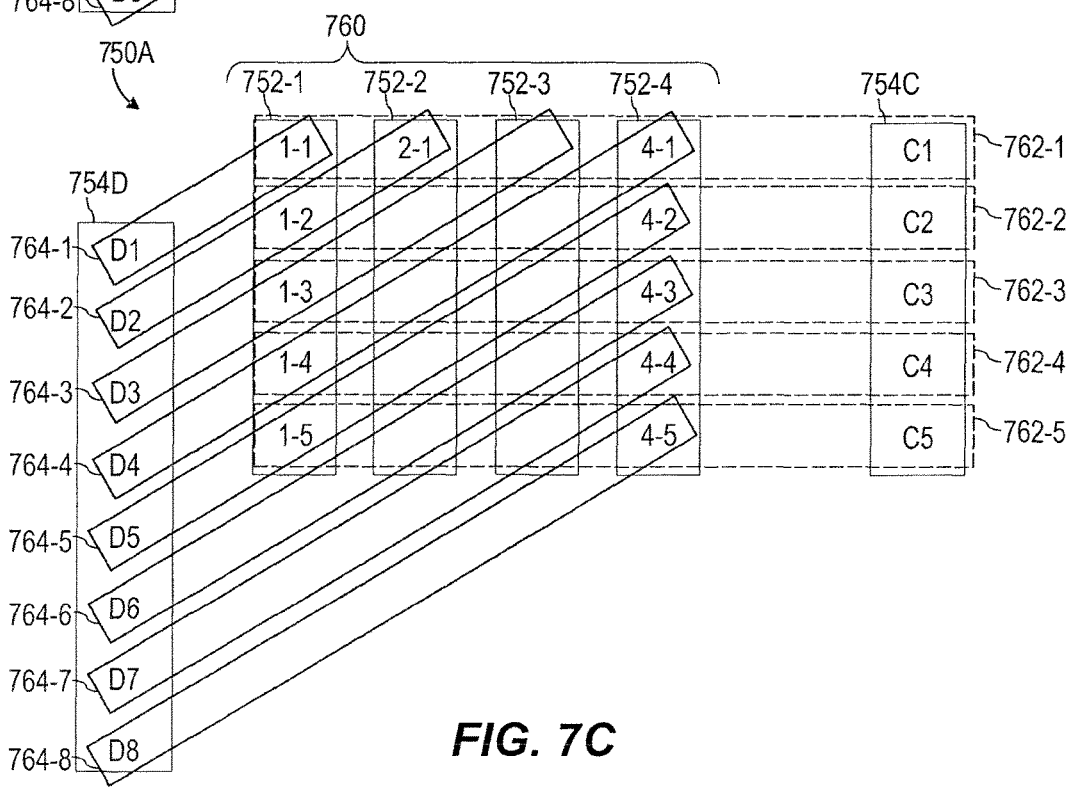

The method illustrated by the flowchart 700 of FIG. 7A may be used to repair the missing data packets 752-2, 752-3 of FIG. 7B. At operation 710 of FIG. 7A, the method may include repairing a data unit of one of the missing data packets 752 with the diagonal FEC packet 754D. Repairing a data unit of one of the missing data packets 752 may include identifying a diagonal 764 of the group 760 that is only missing a single data unit, and repairing the only missing data unit in the identified diagonal 764. By way of non-limiting example, diagonals 764-2 and 764-7 of the group 760 of FIG. 7B are each only missing a single data unit. Accordingly, either of diagonal FEC units D2 and D7, which correspond to diagonals 764-2 and 764-7, respectively, may be used to repair a missing data bit. Repairing the missing data unit may include computing an inverse function $f_D^{-1}$ of the function $f_D$ used to generate the diagonal FEC units D1, D2, D3, . . . . By way of non-limiting example, missing data unit 2-1 may be computed as a function $f_D^{-1}$ of diagonal FEC unit D2 and data unit 1-2 (i.e., 2-1=$f_D^{-1}$(D2, 1-2). As a specific, non-limiting example, if the function $f_D$ is the addition function, and data unit 1-2 is equal to 3, and diagonal FEC unit D2 is equal to 5, data unit 2-1 is equal to 2 (i.e., 2-1=D1−1-2=5−3=2). FIG. 7C illustrates the repaired data unit 2-1 populated into the group 760.

Figure 7D:
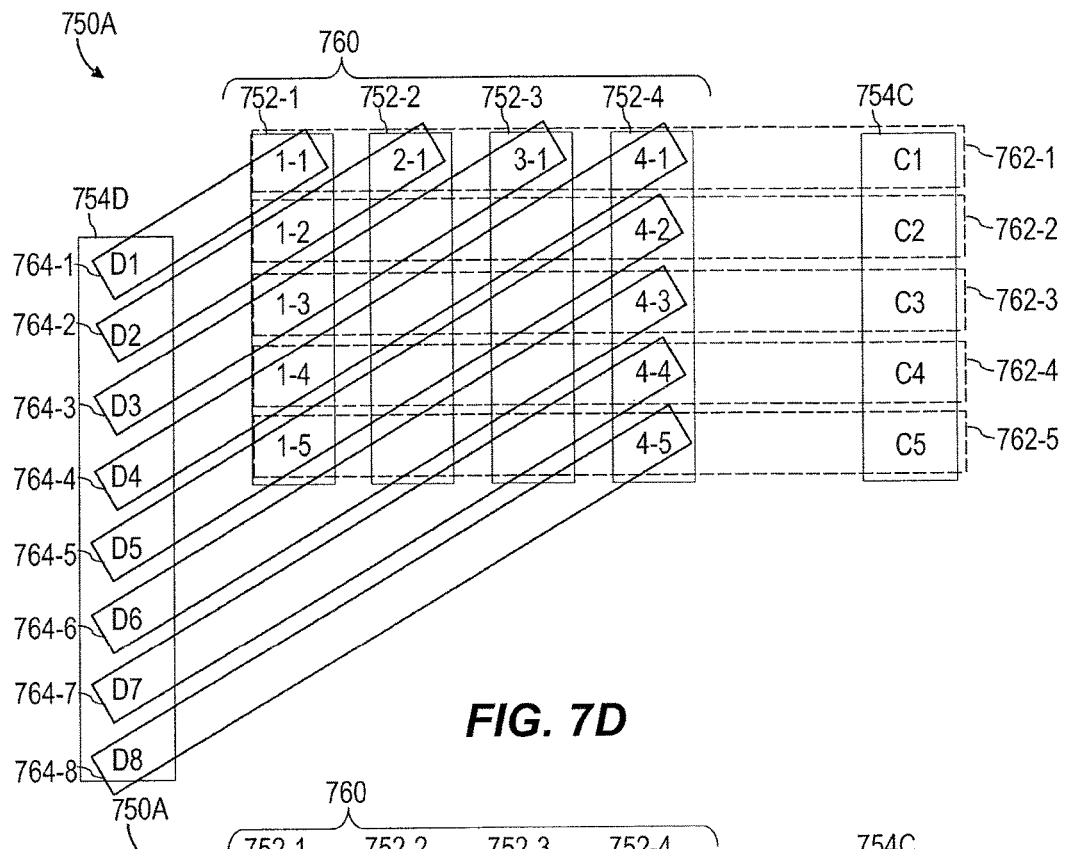

At operation 720 of FIG. 7A, the method may include repairing a data unit of one of the missing data packets 752 with the row FEC packet 754C. Repairing a data unit of one of the missing data packets 752 may include identifying a row 762 of the group 760 that is only missing a single data unit, and repairing the missing data unit in the identified row 762. By way of non-limiting example, row 762-1 of FIG. 7C is only missing a single data unit. Accordingly, row FEC unit C1 may be used to repair missing data unit 3-1. Repairing the missing data unit may include computing an inverse function $f_C^{-1}$ of the function $f_C$ used to generate the row FEC units C1, C2, C3, C4. By way of non-limiting example, missing data unit 3-1 may be computed as a function $f_C^{-1}$ of row FEC unit C1 and data units 1-1, 2-1, and 4-1 (i.e., 3-1=$f_C^{-1}$(C1, 1-1, 2-1, 4-1)). As a specific, non-limiting example, if the function $f_C$ is the addition function, and data units 1-1, 2-1, and 4-1 are equal to 5, 2, and 5, respectively, and row FEC unit C1 is equal to 19, data unit 3-1 is equal to 7 (i.e., 3-1=C1−1-1−1-2−4-1=19−5−2−5=7). FIG. 7D illustrates the repaired data unit 3-1 populated into the group 760.

At operation 730 of FIG. 7A, the method may include determining whether there are more data units that need to be repaired. If it is determined that no more data units are in need of repair, at operation 740, the method may end. As illustrated in FIG. 7D, however, several missing data units remain to be repaired.

Figure 7E:
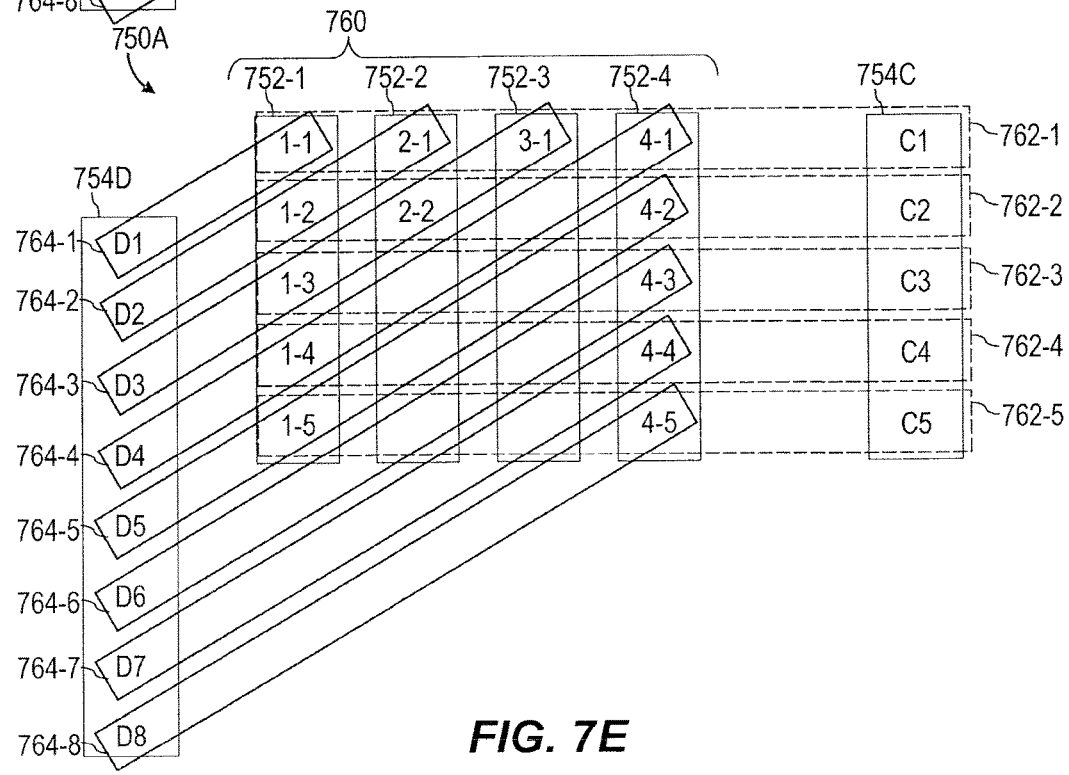

Returning to operation 730, if it is determined that more data units are in need of repair, the method may include returning to operation 710. By way of non-limiting example, in FIG. 7D, several missing data units remain to be repaired. Accordingly, returning to operation 710, diagonal 764-3 of FIG. 7D is only missing a single data unit (i.e., data unit 2-2). The missing data unit 2-2 may be computed as the inverse function $f_D^{-1}$ of diagonal FEC unit D3 and data units 1-3 and 3-1 (i.e., 2-2=$f_D^{-1}$(D3, 1-3, 3-1)). FIG. 7E illustrates the repaired data unit 2-2 populated into the group 760.

Figure 7F:
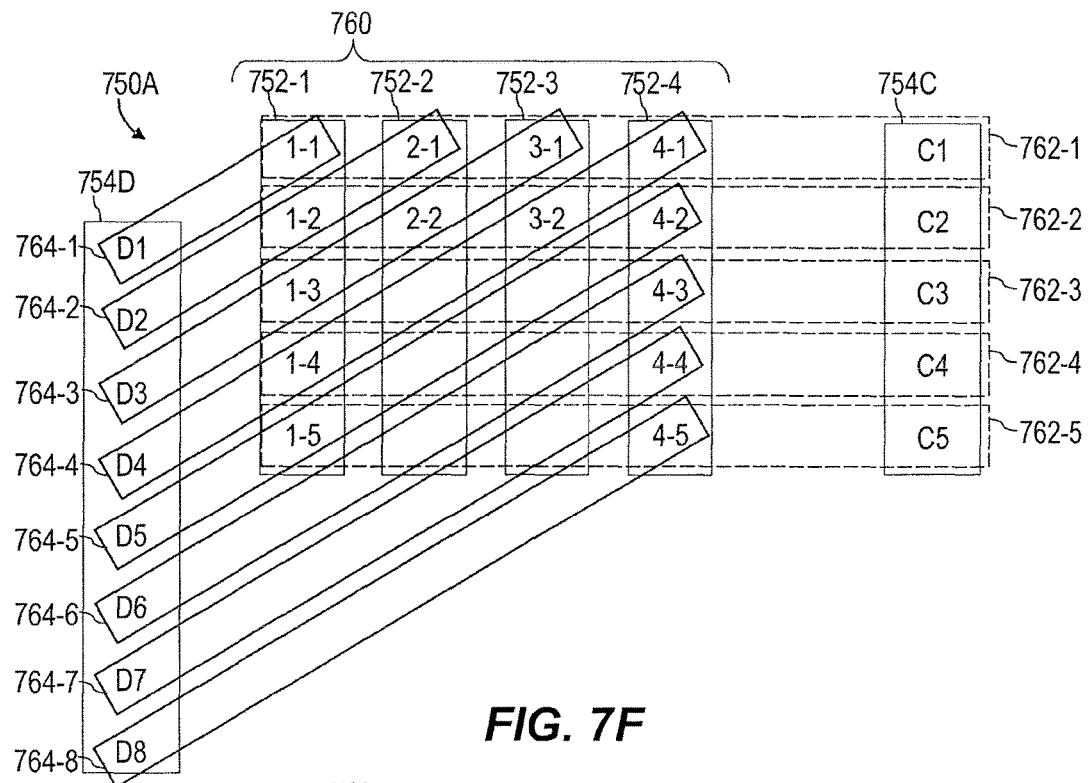

At operation 720, row FEC unit C2 may be used to repair data unit 3-2 because data unit 3-2 of FIG. 7E is the only missing data unit of row 762-2. By way of non-limiting example, the missing data unit 3-2 may be computed as the inverse function $f_C^{-1}$ of row FEC unit C2 and data units 1-2, 2-2, and 4-2 (i.e., 3-2=$f_C^{-1}$(C2, 1-2, 2-2, 4-2)). FIG. 7F illustrates the repaired data unit 3-2 populated into the group 760.

Figure 7G:
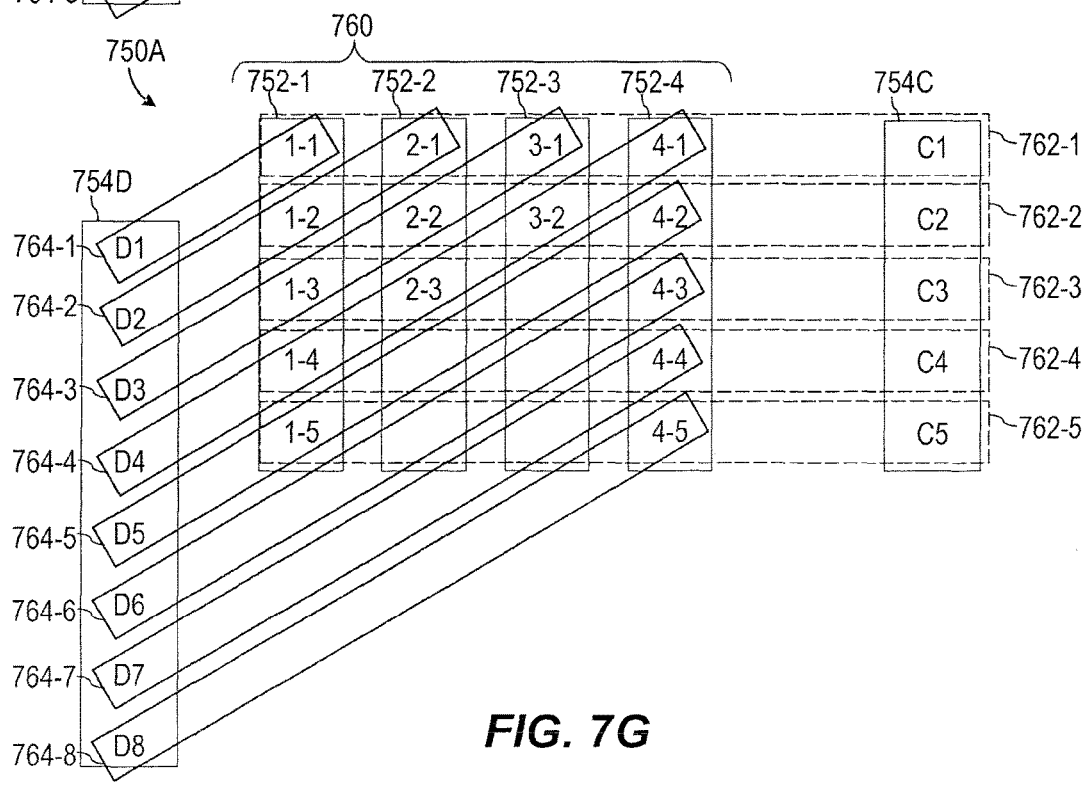

At operation 730, it may be determined that more data units of FIG. 7F are in need of repair. Accordingly, returning to operation 710, diagonal 764-4 of FIG. 7F is only missing a single data unit (i.e., data unit 2-3). The missing data unit 2-3 may be computed as the inverse function $f_D^{-1}$ of diagonal FEC unit D4 and data units 1-4, 3-2, and 4-1 (i.e., 2-3=$f_D^{-1}$(D4, 1-4, 3-2, 4-1)). FIG. 7G illustrates the repaired data unit 2-3 populated into the group 760.

Figure 7H:
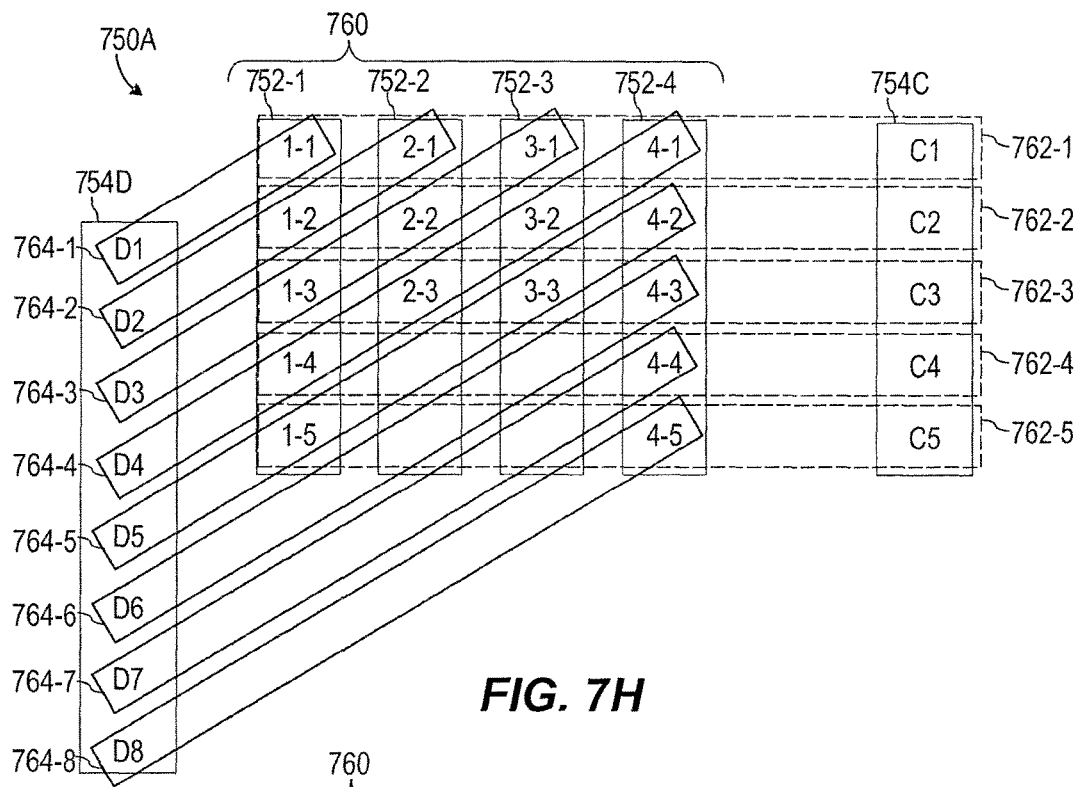

At operation 720, row FEC unit C3 may be used to repair data unit 3-3 because data unit 3-3 of FIG. 7G is the only missing data unit of row 762-3. By way of non-limiting example, the missing data unit 3-3 may be computed as the inverse function $f_C^{-1}$ of row FEC unit C3 and data units 1-3, 2-3, and 4-3 (i.e., 3-3=$f_C^{-1}$(C3, 1-3, 2-3, 4-3)). FIG. 7H illustrates the repaired data unit 3-3 populated into the group 760.

Figure 7I:
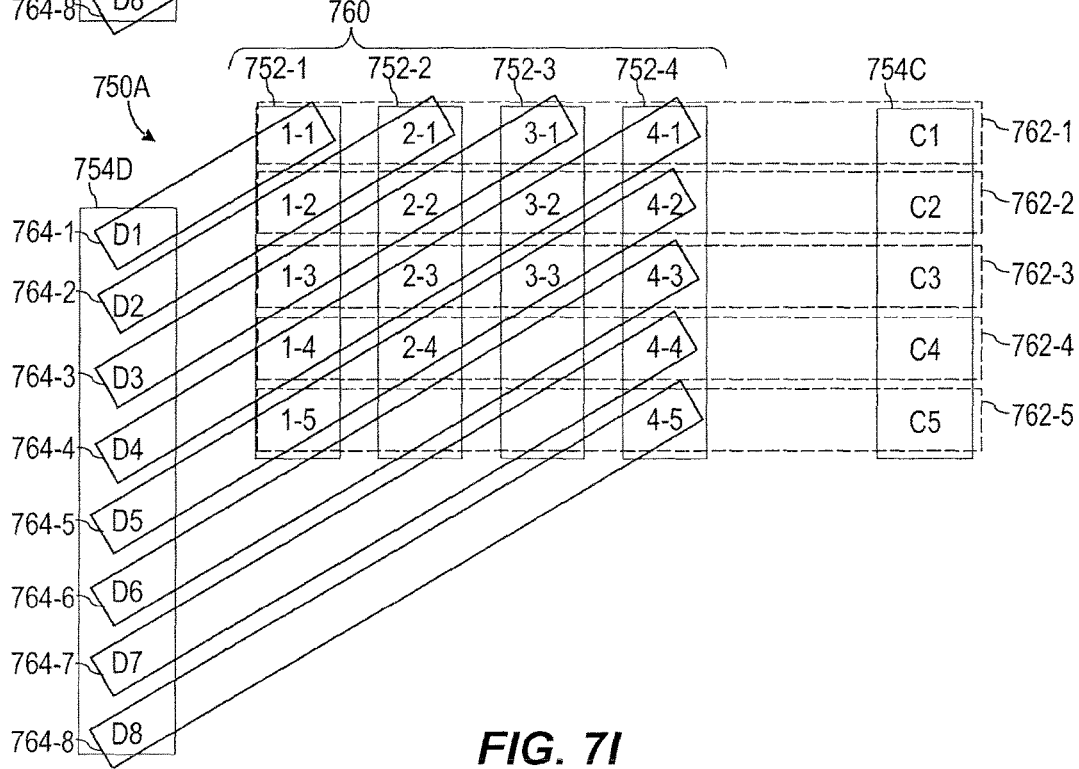

At operation 730, it may be determined that more data units of FIG. 7H are in need of repair. Accordingly, returning to operation 710, diagonal 764-5 of FIG. 7H is only missing a single data unit (i.e., data unit 2-4). The missing data unit 2-4 may be computed as the inverse function $f_D^{-1}$ of diagonal FEC unit D5 and data units 1-5, 3-3, and 4-2 (i.e., 2-4=$f_D^{-1}$(D5, 1-5, 3-3, 4-2)). FIG. 7I illustrates the repaired data unit 2-4 populated into the group 760.

Figure 7J:
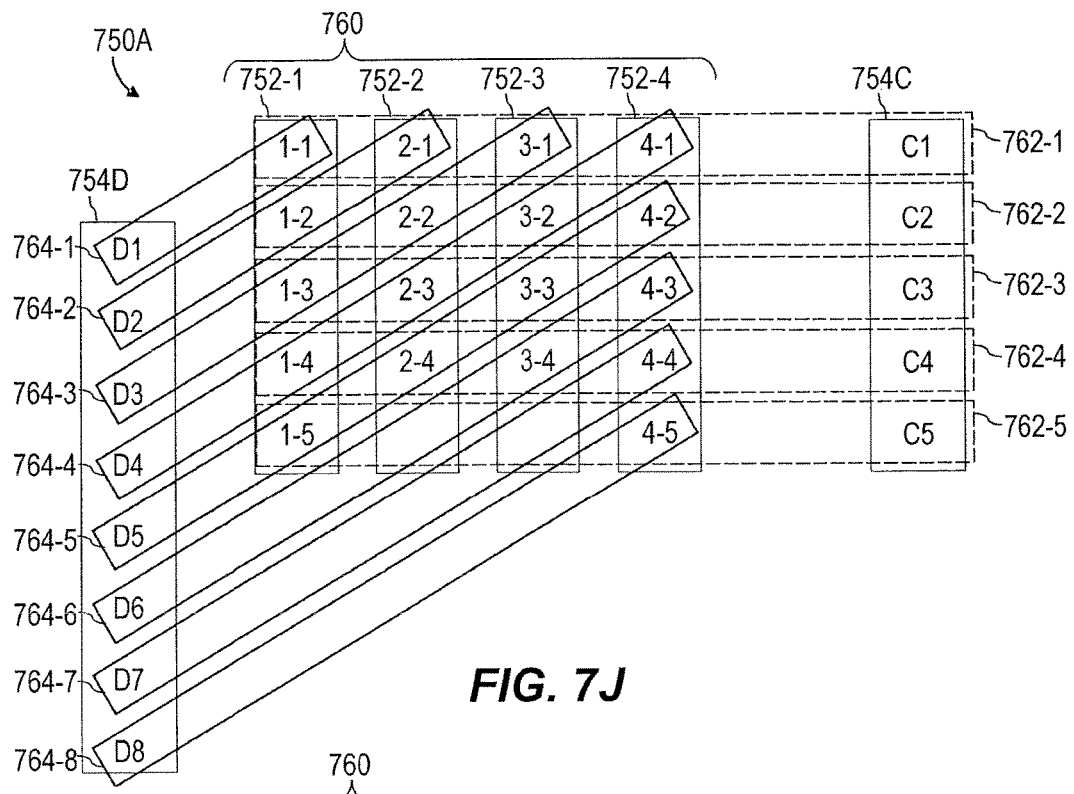

At operation 720, row FEC unit C4 may be used to repair data unit 3-4 because data unit 3-4 of FIG. 7I is the only missing data unit of row 762-4. By way of non-limiting example, the missing data unit 3-4 may be computed as the inverse function $f_C^{-1}$ of row FEC unit C4 and data units 1-4, 2-4, and 4-4 (i.e., 3-4=$f_C^{-1}$(C4, 1-4, 2-4, 4-4)). FIG. 7J illustrates the repaired data unit 4-3 populated into the group 760.

Figure 7K:
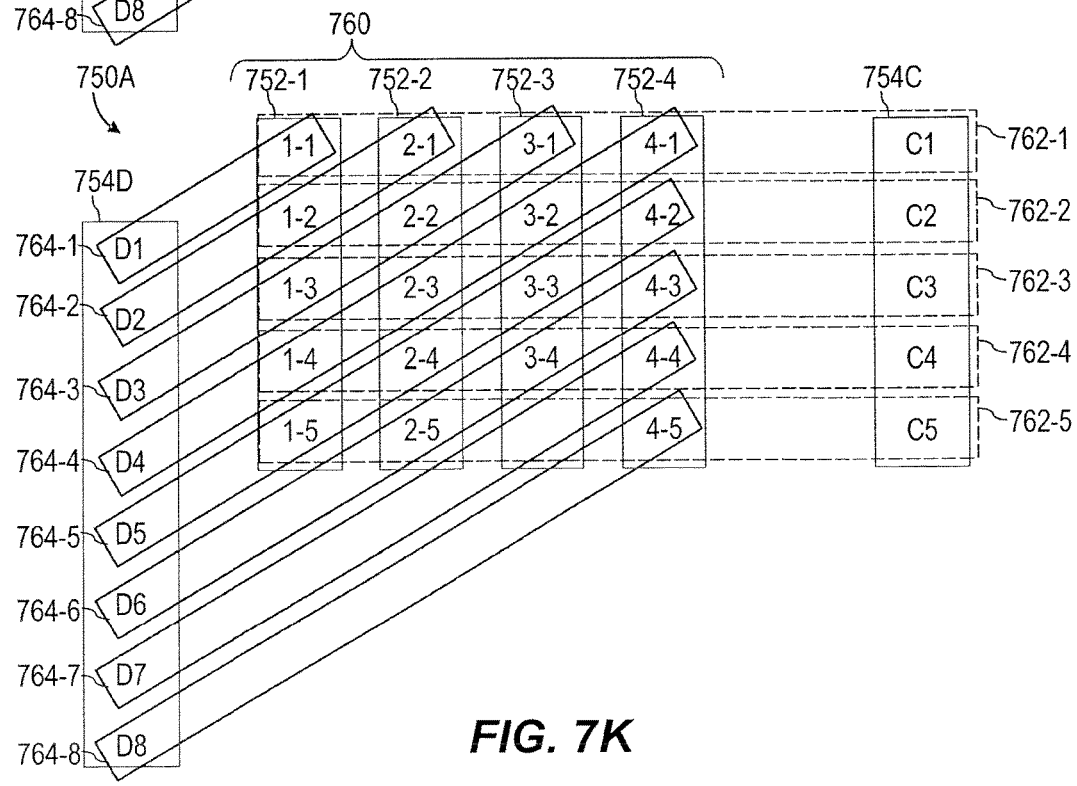

At operation 730, it may be determined that more data units of FIG. 7J are in need of repair. Accordingly, returning to operation 710, diagonal 764-6 of FIG. 7J is only missing a single data unit (i.e., data unit 2-5). The missing data unit 2-5 may be computed as the inverse function $f_D^{-1}$ of diagonal FEC unit D6 and data units 3-4, and 4-3 (i.e., 2-5=$f_D^{-1}$(D6, 3-4, 4-3)). FIG. 7K illustrates the repaired data unit 2-5 populated into the group 760.

Figure 7L:
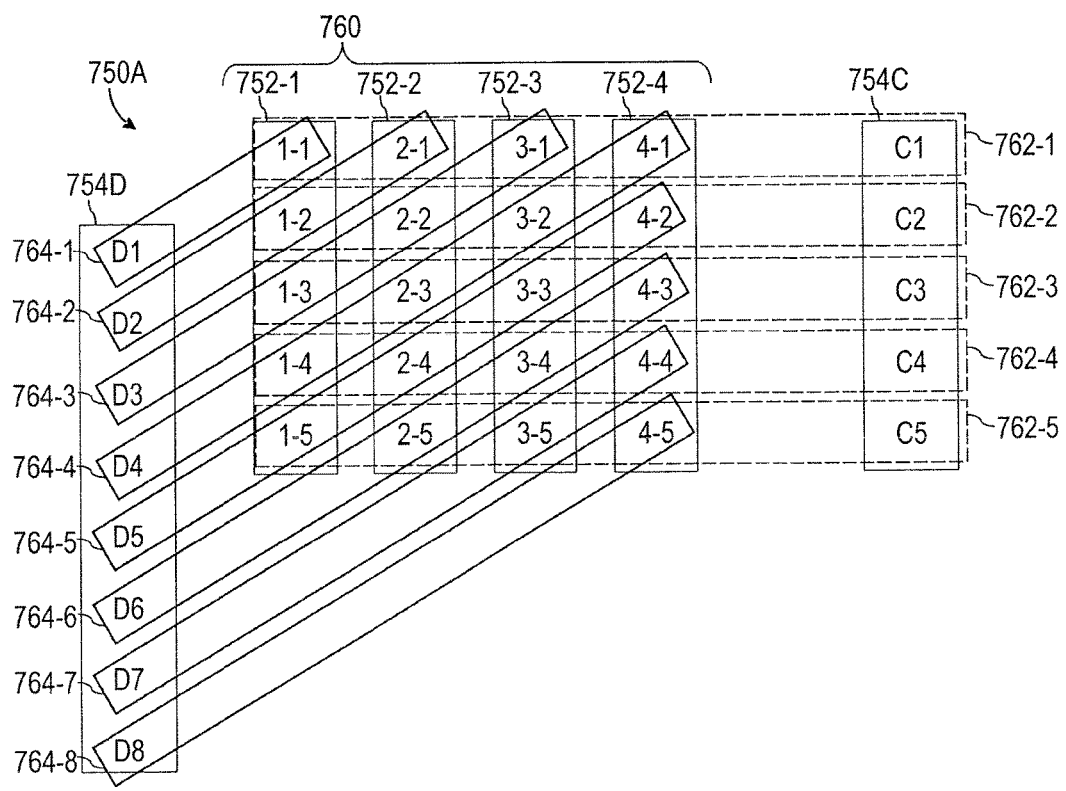

At operation 720, row FEC unit C5 may be used to repair data unit 3-5 because data unit 3-5 of FIG. 7K is the only missing data unit of row 762-5. By way of non-limiting example, the missing data unit 3-5 may be computed as the inverse function $f_C^{-1}$ of row FEC unit C5 and data units 1-5, 2-5, and 4-5 (i.e., 3-5=$f_C^{-1}$(C5, 1-5, 2-5, 4-5)). FIG. 7L illustrates the repaired data unit 5-3 populated into the group 760.

At operation 730, it may be determined that there are no more missing data units in the group 760 of FIG. 7L. Accordingly, at operation 740, the method may end, and the group 760 may be fully repaired.

Figure 8A:
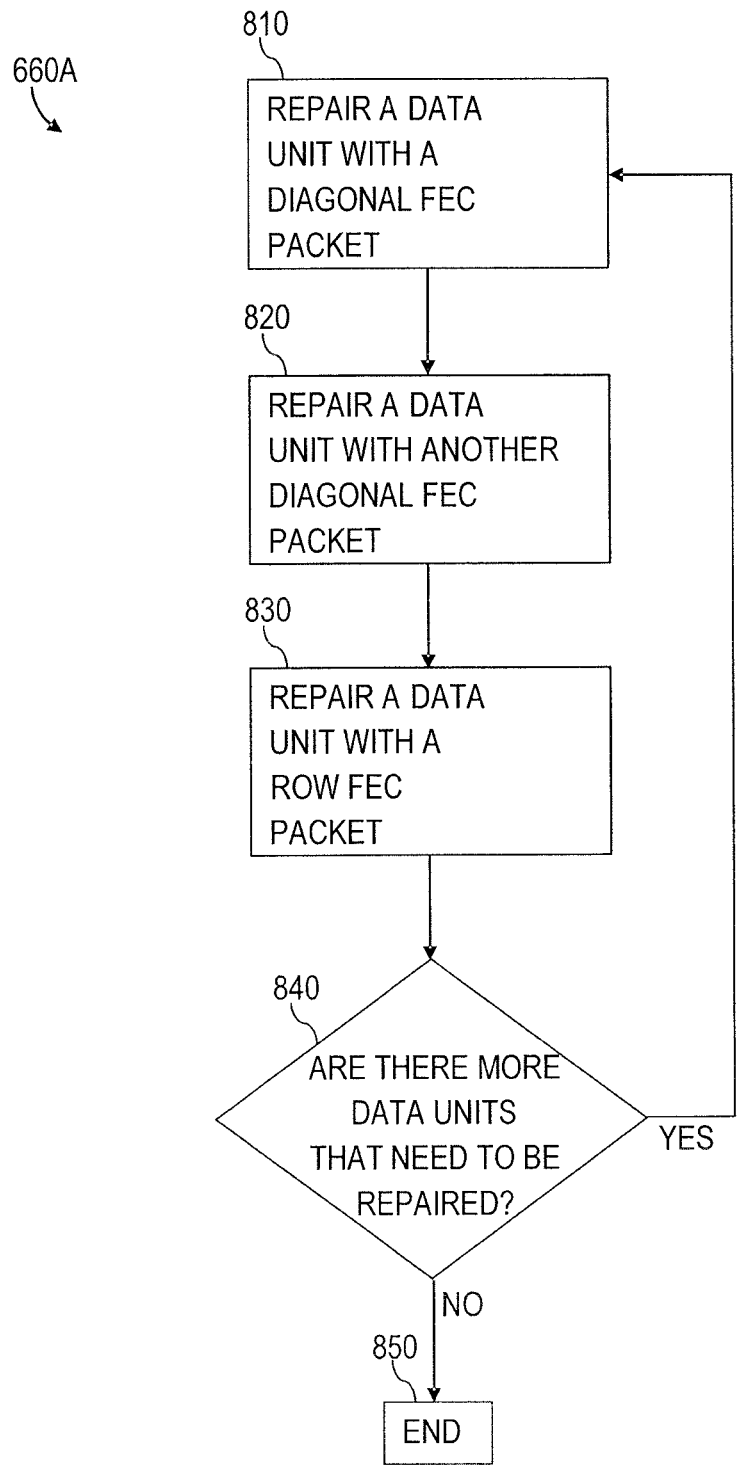
FIGS. 8A through 8K illustrate an example method for repairing a group of data packets using triple-parity forward error correction.
Figure 8B:
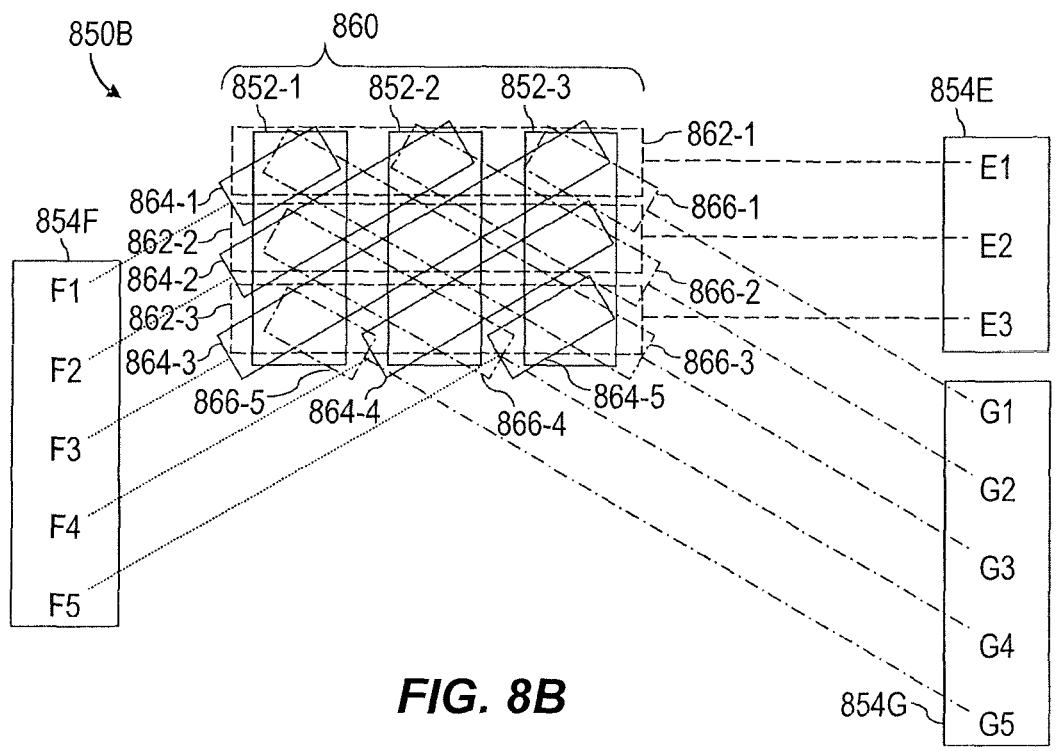

FIGS. 8A through 8K illustrate an example method for repairing a group 860 of data packets 852 using triple-parity FEC. FIG. 8A is a flowchart 800 illustrating the method for repairing the group 860 of data packets 752 using triple-parity FEC. FIGS. 8B through 8K illustrate a portion 850B of packetized far-end data 150 (FIGS. 1 and 2) received by the communication endpoint 200 (FIGS. 1 and 2) from the far-end communication endpoint 120 (FIG. 1). Referring to FIGS. 8A through 8K together, the received packetized far-end data 150 may include the portion 850B. The portion 850B may include a group 860 of far-end data packets 852-1, 852-2, 852-3 (sometimes referred to herein generically together as "data packets" 852), a row FEC packet 854E corresponding to the group 860, a diagonal FEC packet 854F corresponding to the group 860, and another diagonal FEC packet 854G corresponding to the group 860. As illustrated in FIG. 8B, three of the data packets 852-1, 852-2, 852-3 may have been lost during transmission from the far-end communication endpoint 120.

The row FEC packet 854E may include row FEC units E1, E2, and E3 generated using a row parity of data units 1-1, 1-2, 1-3, . . . 3-2, 3-3 (sometimes referred to herein simply as "data units") by the far-end communication endpoint 120. Specifically, the row FEC units E1, E2, and E3 may have been generated by computing a function $f_E$ of each of the data units in a row 862-1, 862-2, and 862-3 of the group 860 that corresponds thereto (i.e., E1=$f_E$(1-1, 2-1, 3-1), E2=$f_E$(1-2, 2-2, 3-2), E3=$f_E$(1-3, 2-3, 3-3)). By way of non-limiting example, if the function $f_E$ is an addition function, and data units 1-1, 2-1, and 3-1 are equal to 8, 3, and 5, respectively, then E1 may be equal to 8+3+5=16.

The diagonal FEC packet 854F may include diagonal FEC units F1, F2, F3, . . . generated using a diagonal parity of the of the data units by the far-end communication endpoint 120. Specifically, the diagonal FEC units F1, F2, F3, . . . may have been generated by computing a function $f_F$ of each of the data units in a diagonal 864-1, 864-2, 864-3, . . . of the group 860 that corresponds thereto (i.e., F1=$f_F$(1-1), F2=$f_F$(1-2, 2-1), F3=$f_F$(1-3, 2-2, 3-1), F4=$f_F$(2-3, 3-2), F5=$f_F$(3-3)). By way of non-limiting example, if the function $f_F$ is an addition function, and data unit 1-1 is equal to 8, then F1 may be equal to 8. Also by way of non-limiting example, if the function $f_F$ is the addition function, and data units 1-2 and 2-1 are equal to 6 and 3, respectively, FEC unit F2 may be equal to 6+3=9.

The other diagonal FEC packet 854G may include other diagonal FEC units G1, G2, G3, . . . generated using another diagonal parity of the of the data units by the far-end communication endpoint 120. Specifically, the other diagonal FEC units G1, G2, G3, . . . may have been generated by computing a function $f_G$ of each of the data units in another diagonal 866-1, 866-2, 866-3, . . . of the group 860 that corresponds thereto (i.e., G1=$f_G$(3-1), G2=$f_G$(2-1, 3-2), G3=$f_G$(1-1, 2-2, 3-3), G4=$f_G$(1-2, 2-3), G5=$f_G$(1-3)). By way of non-limiting example, if the function $f_G$ is an addition function, and data unit 3-1 is equal to 5, then G1 may be equal to 5. Also by way of non-limiting example, if the function $f_G$ is the addition function, and data units 2-1 and 3-2 are equal to 3 and 1, respectively, FEC unit G2 may be equal to 3+1=4.

Figure 8C:
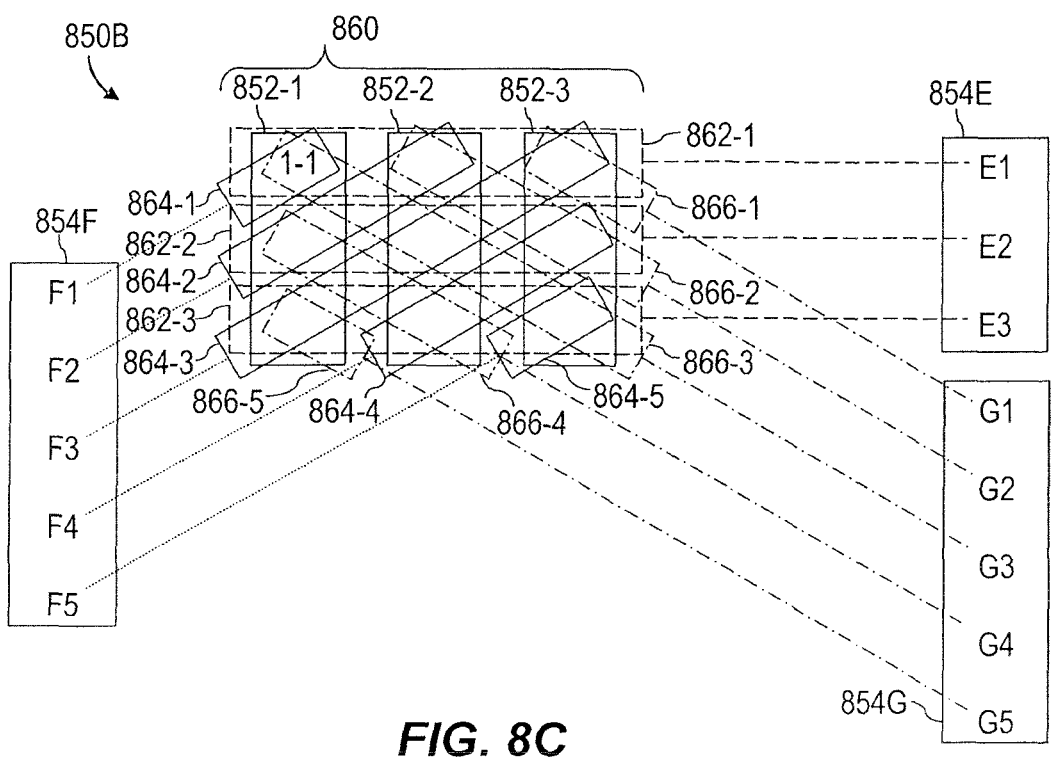

The method illustrated by the flowchart 800 of FIG. 8A may be used to repair the missing data packets 852-1, 852-2, 852-3 of FIG. 8B. At operation 810 of FIG. 8A, the method may include repairing a data unit of one of the missing data packets 852 with the diagonal FEC packet 854F. Repairing a data unit of one of the missing data packets 852 may include identifying a diagonal 864 of the group 860 that is only missing a single data unit, and repairing the only missing data unit in the identified diagonal 864. By way of non-limiting example, diagonals 864-1 and 864-5 of the group 860 of FIG. 8B are each only missing a single data unit. Accordingly, either of diagonal FEC units F1 and F5, which correspond to diagonals 864-1 and 864-5, respectively, may be used to repair a missing data bit. Repairing the missing data unit may include computing an inverse function $f_F^{-1}$ of the function $f_F$ used to generate the diagonal FEC units F1, F2, F3, . . . . By way of non-limiting example, missing data unit 1-1 may be computed as a function $f_F^{-1}$ of diagonal FEC unit F1 (i.e., 1-1=$f_F^{-1}$(F1)). As a specific, non-limiting example, if the function $f_F$ is the addition function, and diagonal FEC unit F1 is equal to 8, data unit 1-1 is equal to 8 (i.e., 1-1=F1=8). FIG. 8C illustrates the repaired data unit 1-1 populated into the group 860.

Figure 8D:
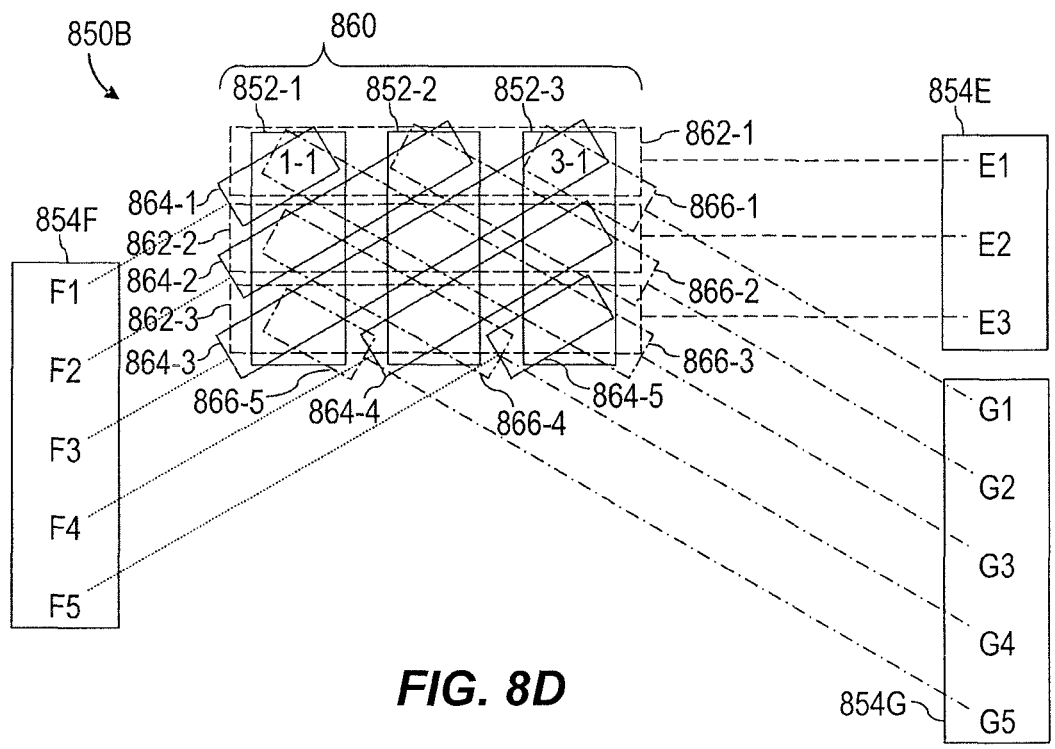

At operation 820 of FIG. 8A, the method may include repairing a data unit of one of the missing data packets 852 with the other diagonal FEC packet 854G. Repairing a data unit of one of the missing data packets 852 may include identifying another diagonal 866 of the group 860 that is only missing a single data unit, and repairing the only missing data unit in the identified other diagonal 866. By way of non-limiting example, diagonal 866-1 of the group 860 of FIG. 8C is only missing a single data unit. Accordingly, other diagonal FEC unit G1, which corresponds to diagonal 866-1 may be used to repair a missing data unit. Repairing the missing data unit may include computing an inverse function $f_G^{-1}$ of the function $f_G$ used to generate the other diagonal FEC units G1, G2, G3, . . . . By way of non-limiting example, missing data unit 1-3 may be computed as a function $f_G^{-1}$ of other diagonal FEC unit G1 (i.e., 1-3=$f_G^{-1}$(G1)). As a specific, non-limiting example, if the function $f_G$ is the addition function, and other diagonal FEC unit G1 is equal to 5, data unit 1-3 is equal to 5 (i.e., 1-3=G1=5). FIG. 8D illustrates the repaired data unit 1-3 populated into the group 860.

Figure 8E:
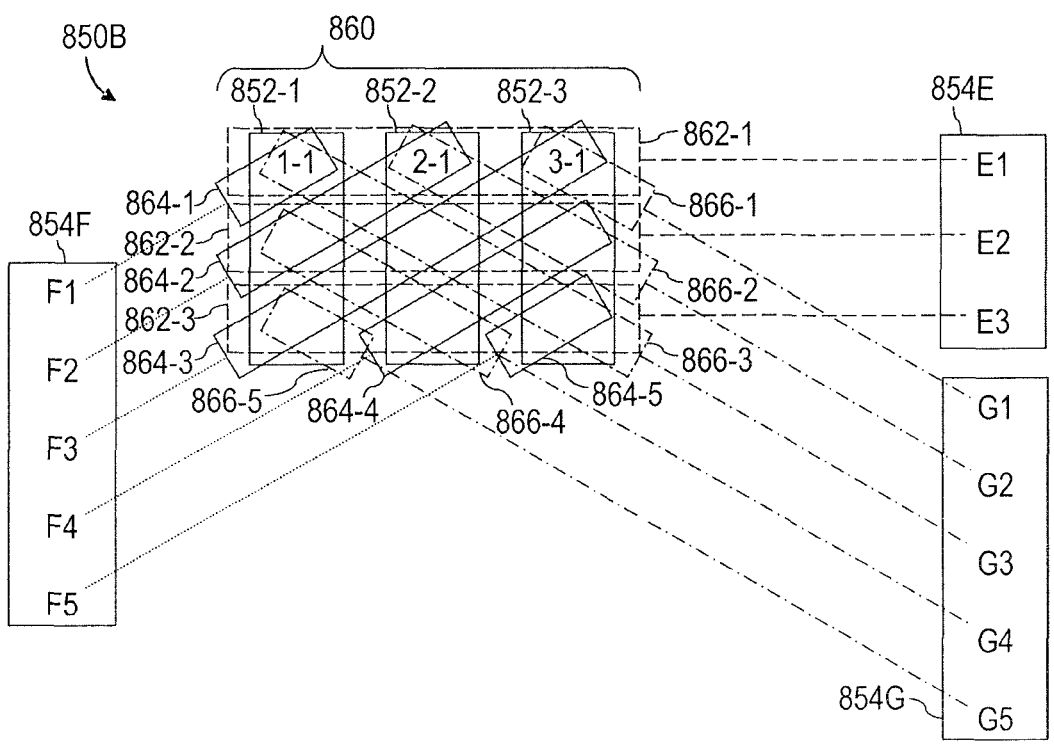

At operation 830 of FIG. 8A, the method may include repairing a data unit of one of the missing data packets 852 with the row FEC packet 854E. Repairing a data unit of one of the missing data packets 852 may include identifying a row 862 of the group 860 that is only missing a single data unit, and repairing the missing data unit in the identified row 862. By way of non-limiting example, row 862-1 of FIG. 8D is only missing a single data unit. Accordingly, row FEC unit E1 may be used to repair missing data unit 2-1. Repairing the missing data unit may include computing an inverse function $f_E^{-1}$ of the function $f_E$ used to generate the row FEC units E1, E2, E3. By way of non-limiting example, missing data unit 2-1 may be computed as a function $f_E^{-1}$ of row FEC unit E1 and data units 1-1, and 3-1 (i.e., 2-1=$f_E^{-1}$(E1, 1-1, 3-1)). As a specific, non-limiting example, if the function $f_E$ is the addition function, and data units 1-1, and 3-1 are equal to 8 and 5, respectively, and row FEC unit E1 is equal to 16, data unit 2-1 is equal to 3 (i.e., 2-1=E1–1-1–3-1=16–8–5=3). FIG. 8E illustrates the repaired data unit 2-1 populated into the group 860.

At operation 840 of FIG. 8A, the method may include determining whether there are more data units that need to be repaired. If it is determined that no more data units are in need of repair, at operation 850, the method may end. As illustrated in FIG. 8E, however, several missing data units remain to be repaired.

Figure 8F:
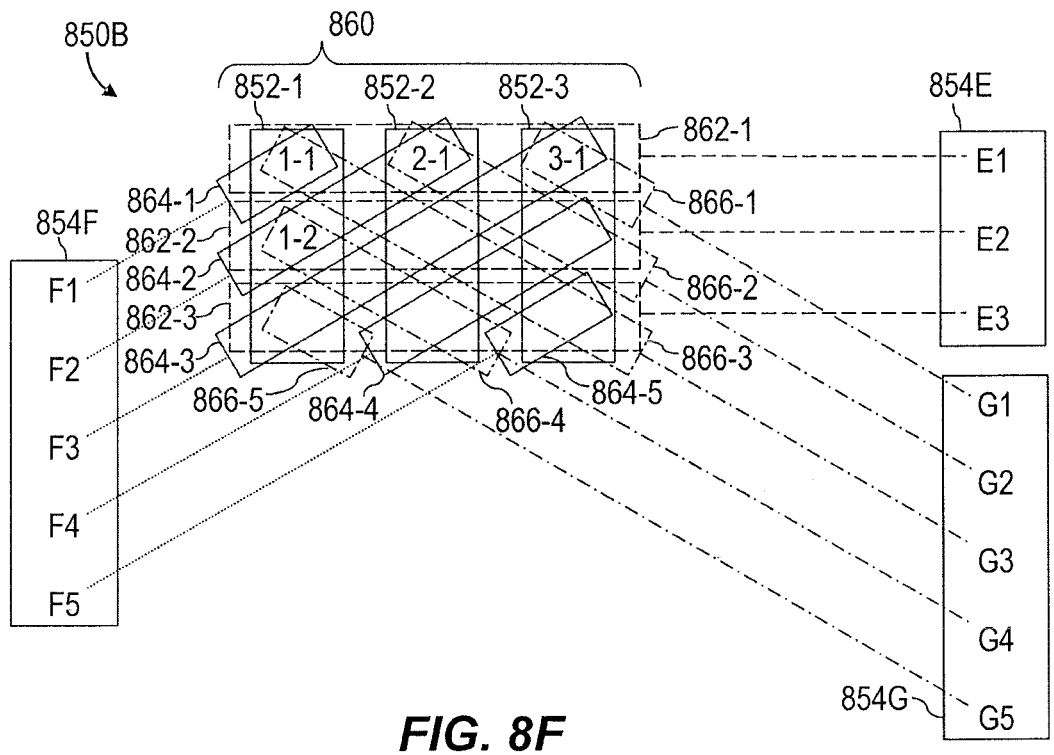

Returning to operation 840, if it is determined that more data units are in need of repair, the method may return to operation 810. By way of non-limiting example, in FIG. 8E, several missing data units remain to be repaired. Accordingly, returning to operation 810, diagonal 864-2 of FIG. 7E is only missing a single data unit (i.e., data unit 1-2). The missing data unit 1-2 may be computed as the inverse function $f_F^{-1}$ of diagonal FEC unit F2 and data unit 2-1 (i.e., 1-2=$f_F^{-1}$(F2, 2-1)). FIG. 8F illustrates the repaired data unit 1-2 populated into the group 860.

Figure 8G:
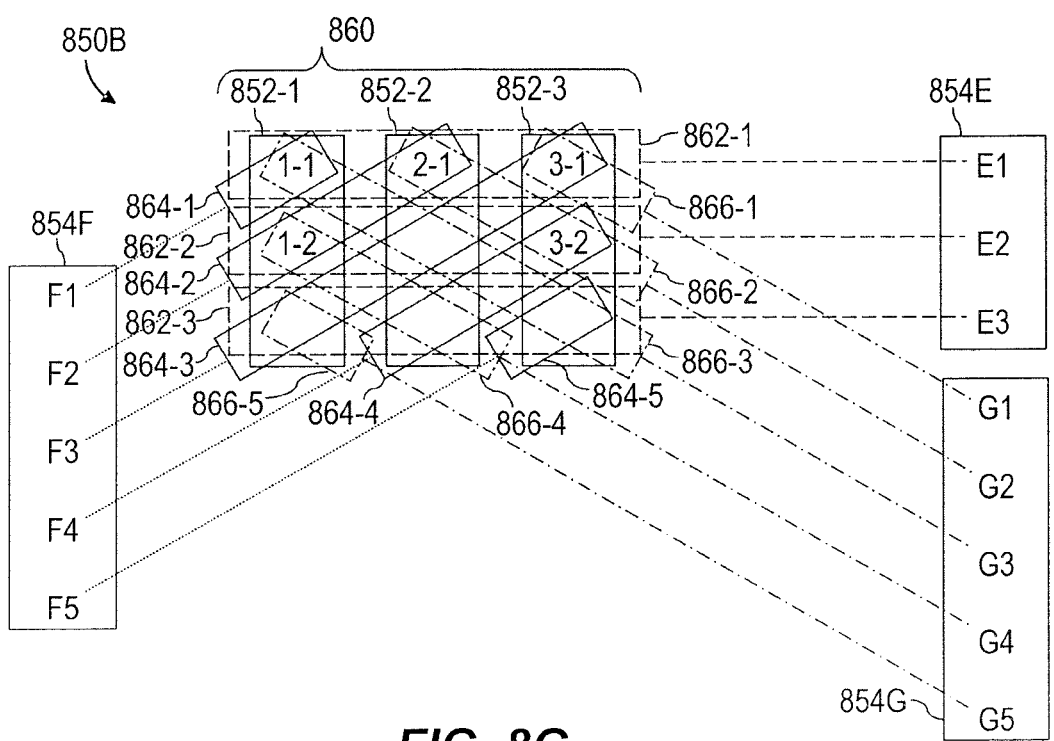

At operation 820, other diagonal 866-2 of FIG. 8F is only missing a single data unit (i.e., data unit 3-2). The missing data unit 3-2 may be computed as the inverse function $f_G^{-1}$ of other diagonal FEC unit G2 and data unit 2-1 (i.e., 3-2=$f_G^{-1}$(G2, 2-1)). FIG. 8G illustrates the repaired data unit 3-2 populated into the group 860.

Figure 8H:
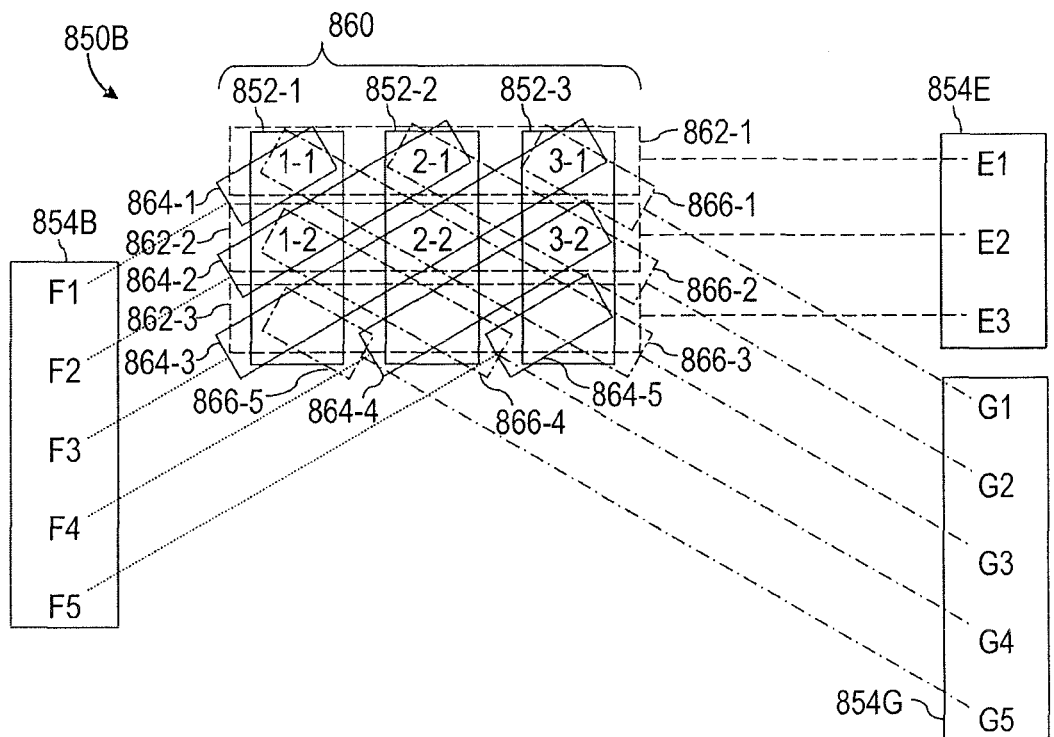

At operation 830, row FEC unit E2 may be used to repair data unit 2-2 because data unit 2-2 of FIG. 8G is the only missing data unit of row 862-2. By way of non-limiting example, the missing data unit 2-2 may be computed as the inverse function $f_E^{-1}$ of row FEC unit E2 and data units 1-2, and 3-2 (i.e., 2-2=$f_E^{-1}$(E2, 1-2, 3-2)). FIG. 8H illustrates the repaired data unit 2-2 populated into the group 860.

Figure 8I:
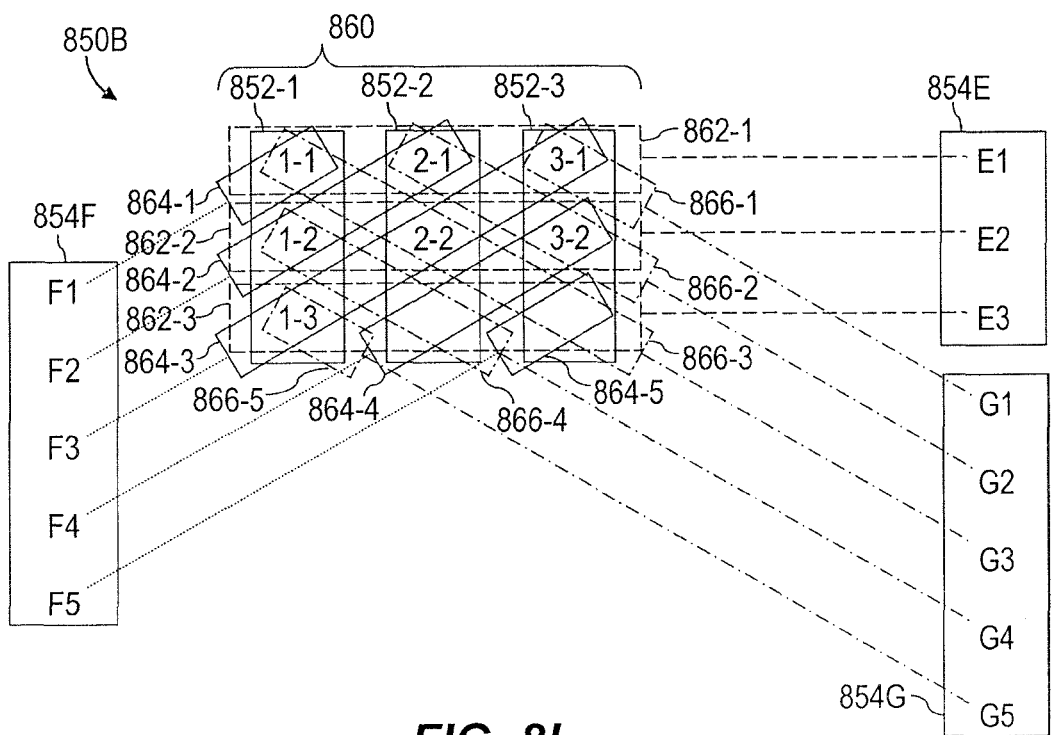

At operation 840, it may be determined that more data units of FIG. 8H are in need of repair. Accordingly, returning to operation 810, diagonal 864-3 of FIG. 8H is only missing a single data unit (i.e., data unit 1-3). The missing data unit 1-3 may be computed as the inverse function $f_F^{-1}$ of diagonal FEC unit F3 and data units 2-2 and 3-1 (i.e., 1-3=$f_F^{-1}$(F3, 2-2, 3-1)). FIG. 8I illustrates the repaired data unit 1-3 populated into the group 860.

Figure 8J:
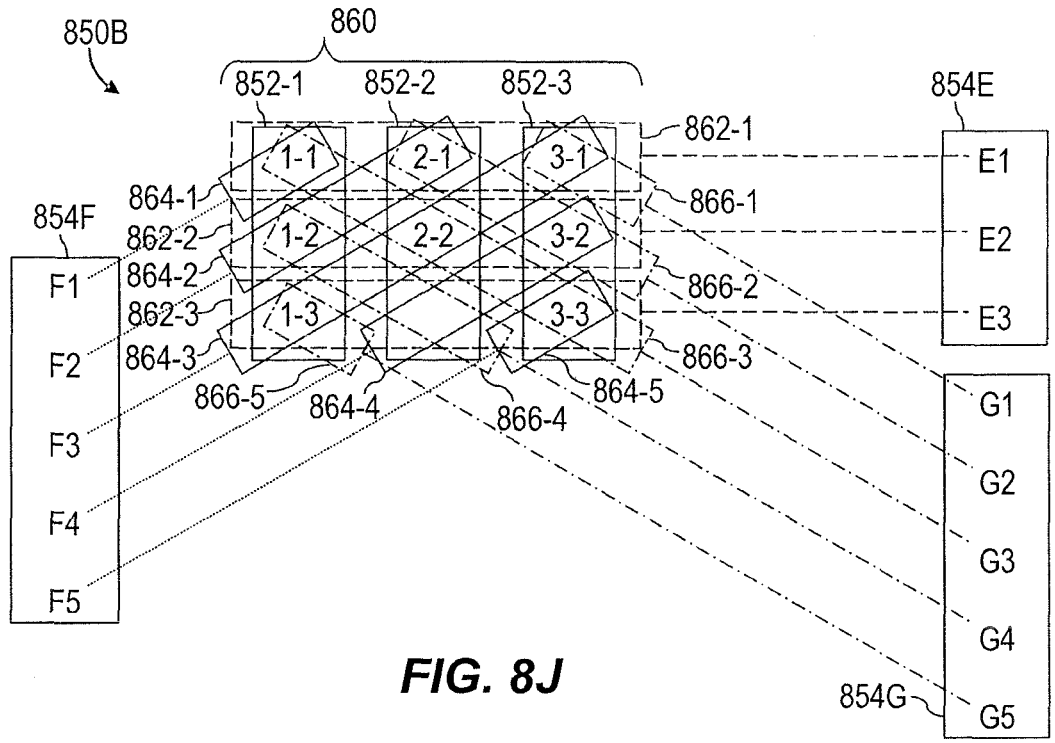

At operation 820, other diagonal 866-3 of FIG. 8I is only missing a single data unit (i.e., data unit 3-1). The missing data unit 3-1 may be computed as the inverse function $f_G^{-1}$ of other diagonal FEC unit G3 and data units 1-1 and 2-2 (i.e., 3-1=$f_G^{-1}$(G3, 1-1, 2-2)). FIG. 8J illustrates the repaired data unit 3-1 populated into the group 860.

At operation 830, row FEC unit E3 may be used to repair data unit 2-3 because data unit 2-3 of FIG. 8J is the only missing data unit of row 862-3. By way of non-limiting example, the missing data unit 2-3 may be computed as the inverse function $f_E^{-1}$ of row FEC unit E3 and data units 1-3 and 3-3 (i.e., 2-3=$f_E^{-1}$(E3, 1-3, 3-3)). FIG. 7K illustrates the repaired data unit 2-3 populated into the group 860.

Figure 8K:
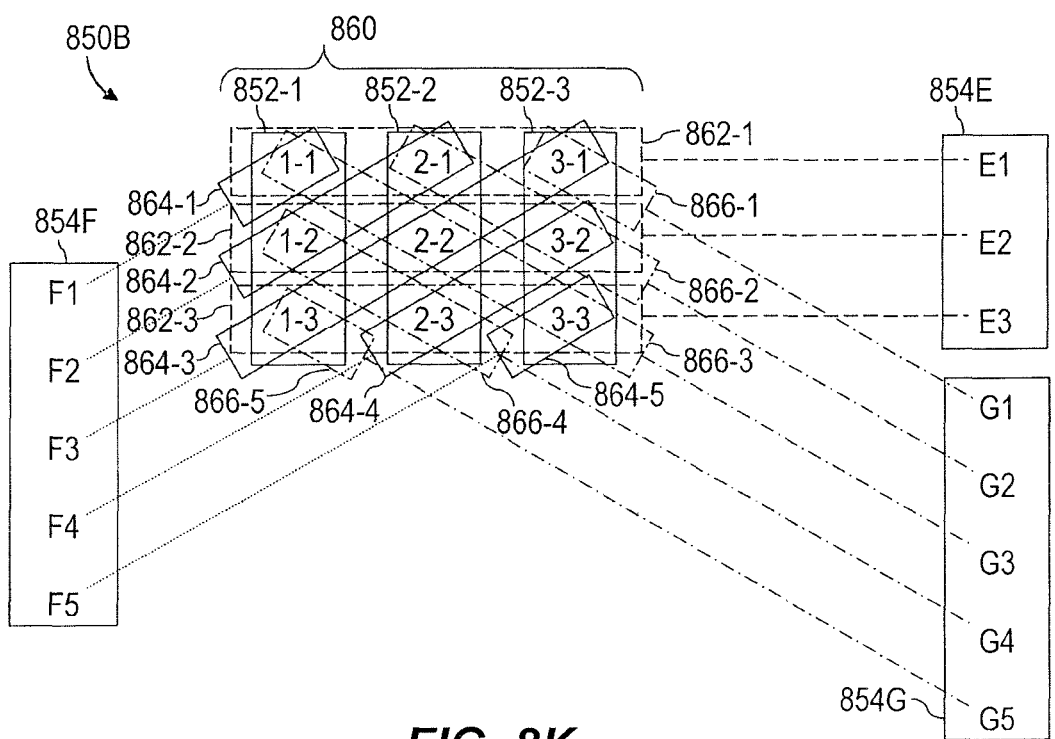

At operation 840, it may be determined that there are no more missing data units in the group 860 of FIG. 8K. Accordingly, at operation 850, the method may end, and the group 860 may be fully repaired.

It should be noted that the methods illustrated in FIGS. 7A through 7L, and in FIGS. 8A through 8K are example methods of specific FEC repair processes. Specifically, FIGS. 7A through 7L illustrate a method that includes alternating between repairing a data unit with a diagonal FEC packet 754D and repairing a data unit with a row FEC packet 754C to repair missing far-end data packets 752. Also, FIGS. 8A through 8K illustrate a method that includes alternating between repairing a data unit with a diagonal FEC packet 854F, repairing a data unit with another diagonal FEC packet 854G, and repairing a data unit with a row FEC packet 854E to repair missing far-end data packets 852. Other methods are also contemplated herein. For example, as long as the number of missing far-end data packets 852 in any given group of data packets 852 does not exceed the number of far-end FEC packets 854 corresponding to the group, there will always be at least one data set (e.g., rows, diagonals) that includes only a single missing data unit until the entire group is repaired. Accordingly, the data units in the group may be repaired one at a time in any order using the far-end FEC packets 854.

It should be recognized that although the example of FIG. 8 (e.g., repair using a row FEC packet and two diagonal FEC packets) is used to repair three missing packets, such an embodiment may also be used to repair a lower number of missing packets. In other words, two packet repair and/or one packet repair may also be accomplished with the two diagonal FEC packets.

Figure 9:
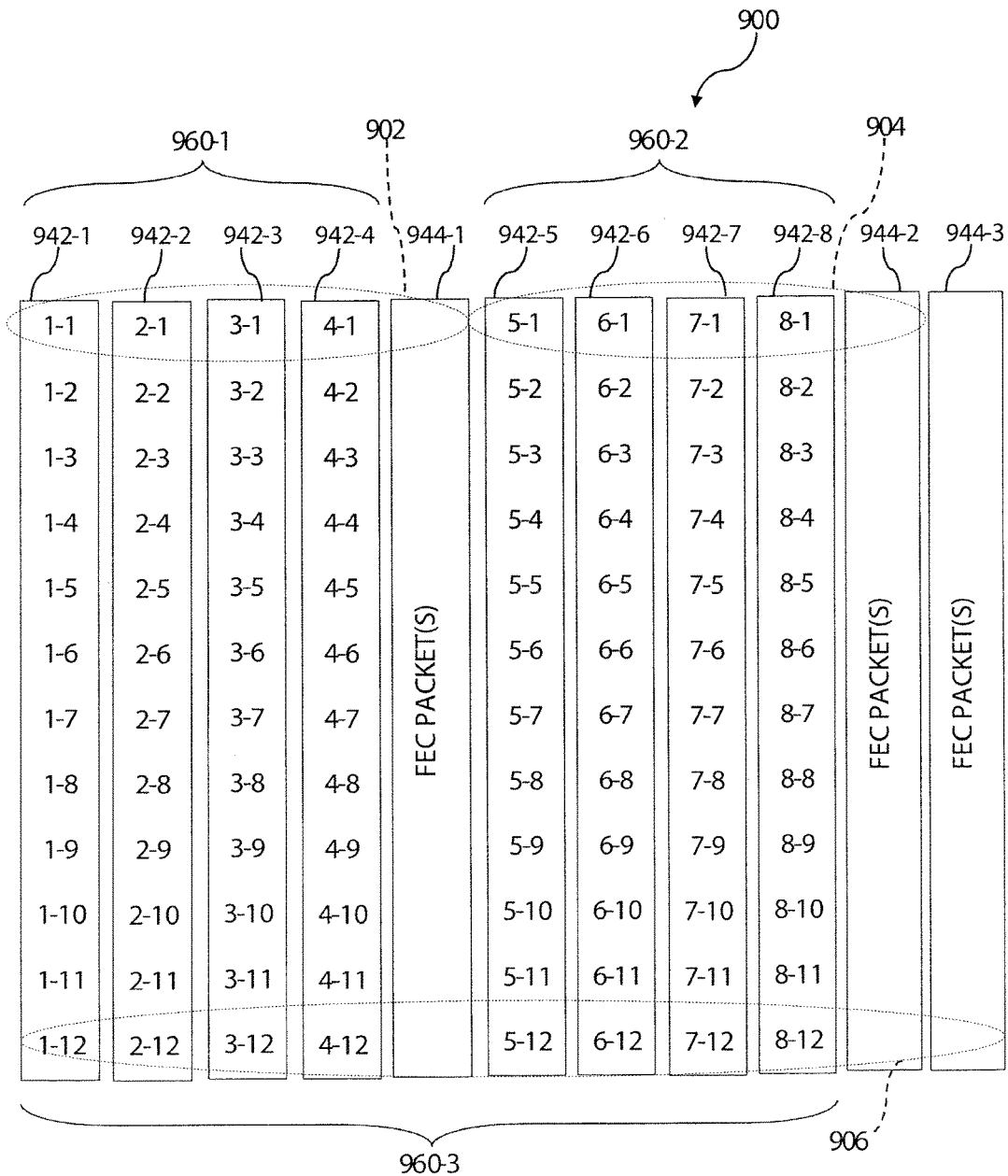
FIG. 9 is a portion of near-end data packets and FEC packets generated and transmitted by a communication system.

FIG. 9 is a portion of near-end data packets and FEC packets generated and transmitted by a communication system according to another embodiment of the disclosure. As illustrated in FIG. 9, the portion may include a first group 960-1 of data packets 942-1, 942-2, 942-3, 942-4, a second group 960-2 of data packets 942-5, 942-6, 942-7, 942-8, and a third group 960-3 of data packets 942-1, 942-2, 942-3, 942-4, 942-5, 942-6, 942-7, 942-8. Thus, as should be appreciated, the third group 960-3 may be a concatenation of the first group 960-1 and the second group 960-2.

FEC packet(s) 944-1, 944-2, 944-3 may also be generated from the different groups of data packets. For example, the first FEC packet(s) 944-1 may be generated using the first group of data packets 960-1 (e.g., data packets 942-1, 942-2, 942-3, 942-4) as indicated by the grouping 902. The second FEC packet(s) may be generated using the second group of data packets 960-2 (e.g., data packets 942-5, 942-6, 942-7, 942-8) as indicated by the grouping 904. The third FEC packet(s) may be generated using the third group of data packets 960-3 (e.g., data packets 942-1, 942-2, 942-3, 942-4, 942-5, 942-6, 942-7, 942-8) as indicated by the grouping 906. Each of the FEC packet(s) 944-1, 944-2, 944-3 may include a row FEC packet, a first diagonal FEC packet, and/or a second diagonal FEC packet as discussed above. In other words, each of the FEC packet(s) 944-1, 944-2, 944-3 blocks shown in FIG. 9 may represent a set of FEC packets depending on the level of parity desired (which may also dynamically change based on use, bandwidth requirements, burstiness, or other factors as discussed above).

As a result of such a system, the third FEC packet(s) 944-3 generated from the third group 960-3 may provide additional redundancy, which may be desirable for particularly important data or in situations in which significant data loss may occur. In some embodiments, the transmission of the packets may be as shown in that the first group of data packets 960-1 may be transmitted to the far-end followed by the first FEC packet(s) 944-1, the second group of data packets 960-2, the second FEC packet(s) 944-2, and the third FEC packet(s) 944-3. Although the third FEC packet(s) 944-3 may be generated using the third group of data packets 960-3, these data packets (e.g., data packets 942-1, 942-2, 942-3, 942-4, 942-5, 942-6, 942-7, 942-8) may not need to be re-sent as they had been sent to the far-end communication device previously.

Figure 10:
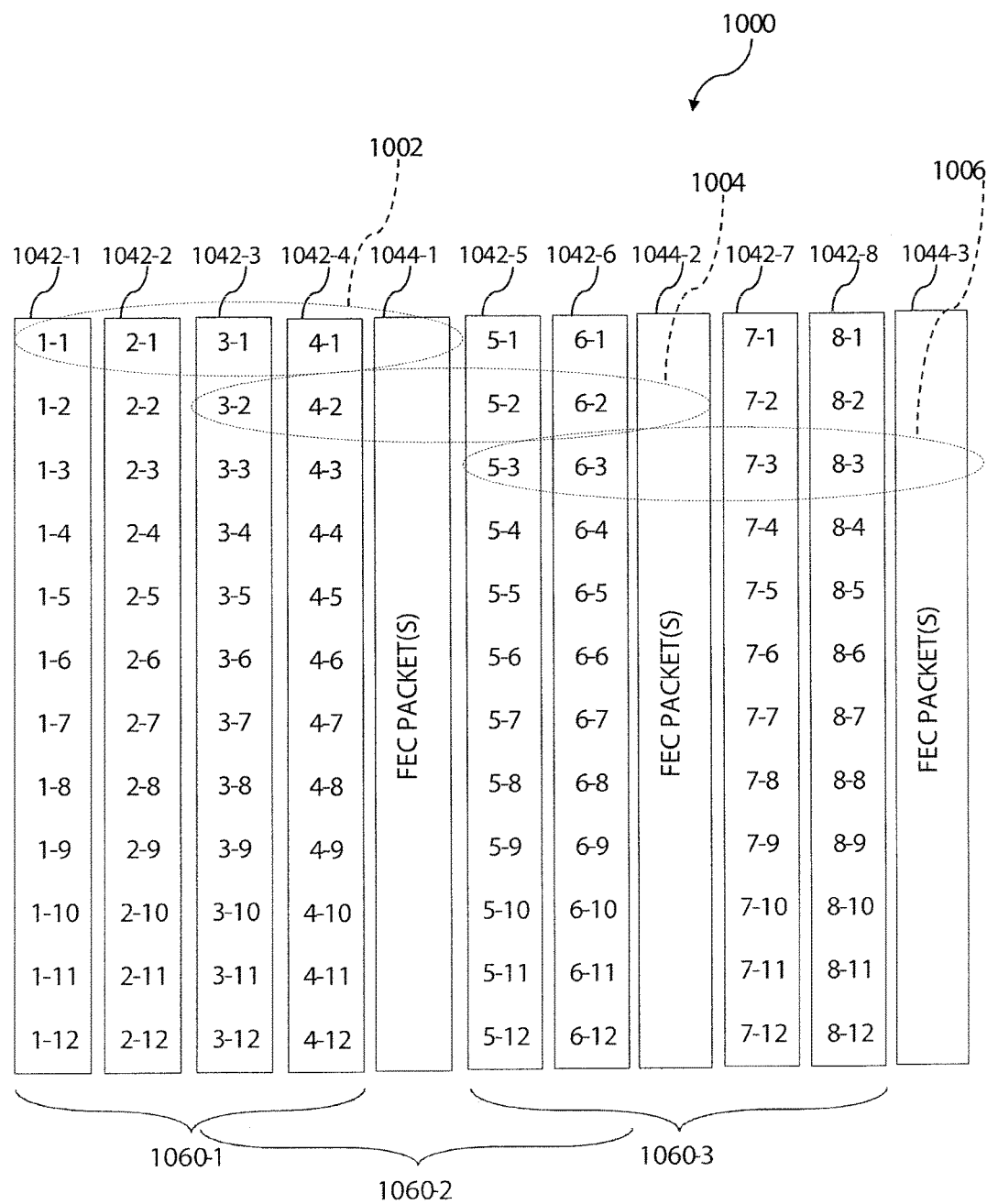
FIG. 10 is a portion of near-end data packets and FEC packets generated and transmitted by a communication system.

FIG. 10 is a portion of near-end data packets and FEC packets generated and transmitted by a communication system according to another embodiment of the disclosure. As illustrated in FIG. 10, the portion may include a first group 1060-1 of data packets 1042-1, 1042-2, 1042-3, 1042-4, a second group 1060-2 of data packets 1042-3, 1042-4, 1042-5, and a third group 1060-3 of data packets 1042-5, 1042-6, 1042-7, 1042-8. Thus, as should be appreciated, the second group 1060-2 may at least partially overlap with the first group 1060-1. Likewise, the third group 1060-3 may at least partially overlap with the second group 1060-2.

FEC packet(s) 1044-1, 1044-2, 1044-3 may also be generated from the different groups of data packets. For example, the first FEC packet(s) 1044-1 may be generated using the first group of data packets 1060-1 (e.g., data packets 1042-1, 1042-2, 1042-3, 1042-4) as indicated by the grouping 1002. The second FEC packet(s) may be generated using the second group of data packets 1060-2 (e.g., data packets 1042-3, 1042-4, 1042-5, 1042-6) as indicated by the grouping 1004. The third FEC packet(s) may be generated using the third group of data packets 1060-3 (e.g., data packets 1042-5, 1042-6, 1042-7, 1042-8) as indicated by the grouping 1006. Each of the FEC packet(s) 1044-1, 1044-2, 1044-3 may include a row FEC packet, a first diagonal FEC packet, and/or a second diagonal FEC packet as discussed above. In other words, each of the FEC packet(s) 1044-1, 1044-2, 1044-3 blocks shown in FIG. 10 may represent a set of FEC packets depending on the level of parity desired (which may also dynamically change based on use, bandwidth requirements, burstiness, or other factors as discussed above).

As a result of such a system, the second FEC packet(s) 1044-2 and the third FEC packet(s) 1044-3 may provide additional redundancy, which may be desirable for particularly important data or in situations in which significant data loss may occur. In some embodiments, the transmission of the packets may be as shown in that the first group of data packets 1060-1 may be transmitted to the far-end followed by the first FEC packet(s) 1044-1. The portion of the second group of data packets 1060-2 that has not been previously sent may then be transmitted, followed by the second FEC packet(s) 1044-2, the portion of the third group of data packets 1060-3 that has not been previously sent, and then the third FEC packet(s) 1042-3. The portions of the second group 1060-2 and the third group 1060-3 that were previously sent may not need to be re-sent to the far-end communication device.

Figure 11:
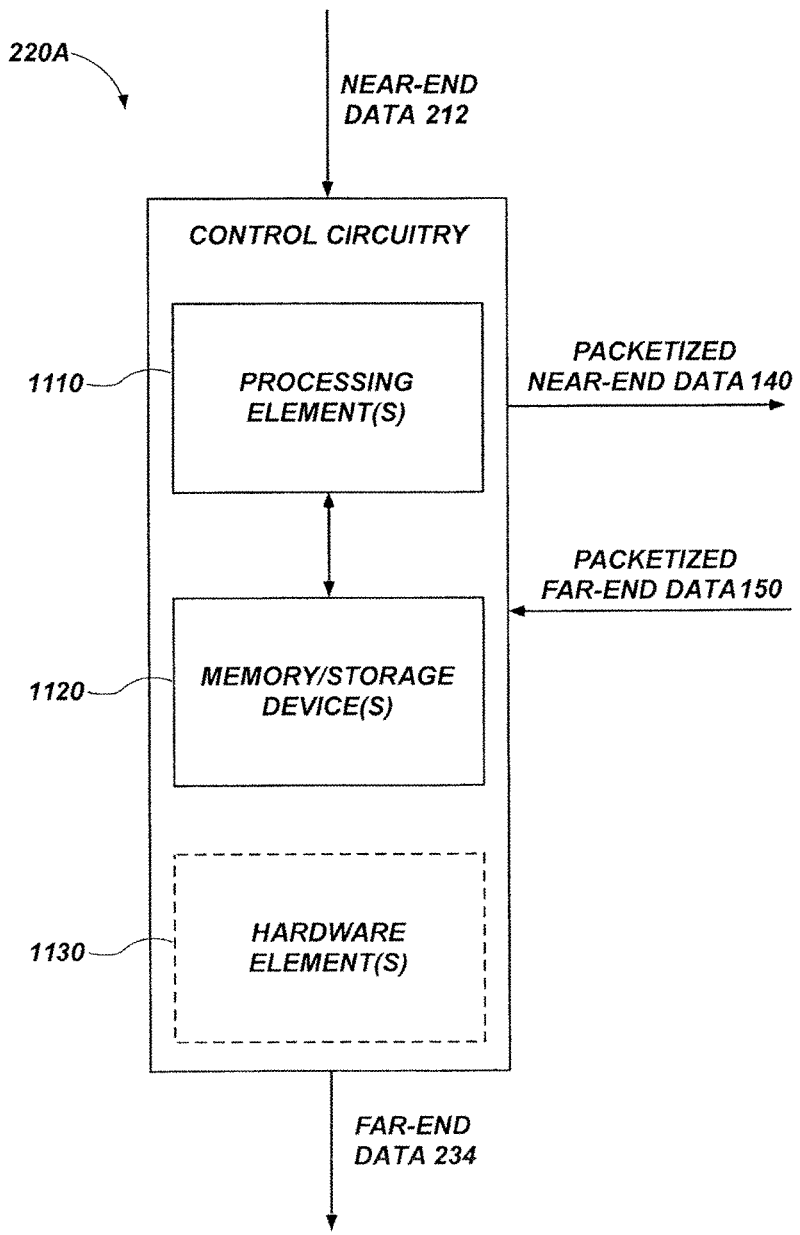
FIG. 11 is a simplified block diagram of example control circuitry of the communication endpoint of FIG. 2.

FIG. 11 is a simplified block diagram of example control circuitry 220A of control circuitry 220 of FIG. 2. The control circuitry 220A may include one or more processing elements 1110 (hereinafter "processing elements" 1110) operably coupled to one or more memory/storage devices 1120 (hereinafter "memory devices" 1120). The memory devices 1120 may be configured to store computer-readable instructions configured to instruct the processing elements 1110 to perform at least a portion of the functions the control circuitry 220, 220A is configured to perform. By way of non-limiting example, the computer-readable instructions may be configured to instruct the processing elements 1110 to perform the functions of at least one of the encoder 222, the packetizing module 224, the FEC packet generator 226, the FEC repair module 228, the assembler 230, and the decoder 232 discussed above with reference to FIG. 2.

The memory devices 1120 may include random access memory (e.g., dynamic random access memory (DRAM), static random access memory (SRAM), etc.), read only memory (e.g., electrically programmable read only memory (EPROM), Flash memory), portable media readers (e.g., compact disc (CD) readers, digital versatile disc (DVD) readers, portable secure digital (SD) card readers, compact flash card readers, etc.) other memory and storage devices, and combinations thereof. In some embodiments, the memory devices 1120 may be configured to permanently store the computer-readable instructions. In some embodiments, the memory devices 1120 may be configured to temporarily store the computer-readable instructions. By way of non-limiting example, the computer-readable instructions may be stored on non-volatile data storage device of the memory devices 1120, and transferred to a volatile memory device of the memory devices 1120 for execution by the processing elements 1110.

Also, data (e.g., near-end data 212, compressed near-end data 223, near-end data packets 142, near-end FEC packets 144, far-end data packets 752, far-end FEC packets 754 repaired far-end data packets 229, compressed far-end data 231, and far-end data 234 may be stored by the memory devices 1120 during processing thereof and otherwise.

The processing elements 1110 may include a microcontroller, a central processing unit (CPU), a programmable logic controller (PLC), other processing circuits, and combinations thereof. The processing elements 1110 may be configured to execute the computer-readable instructions stored in the memory devices 1120. Accordingly, the computer-readable instructions transform the processing elements 1110 and the memory devices 1120 into a special purpose computer configured to carry out embodiments of the disclosure.

In some embodiments, the control circuitry 220A may include one or more hardware elements 1130 (hereinafter "hardware elements" 1130). The hardware elements 1130 may be configured to perform at least some of the functions the control circuitry 220 (FIG. 2) is configured to perform. By way of non-limiting example, the hardware elements 1130 may include hardware implementations of one or more of the encoder 222, the packetizing module 224, the FEC packet generator 226, the FEC repair module 228, the assembler 230, and the decoder 232 discussed above with reference to FIG. 2.

By way of non-limiting example, the hardware elements 1130 may include a field programmable gate array, an application specific integrated circuit (ASIC), a system on chip (SOC), other hardware circuits, and combinations thereof.

The embodiments discussed herein illustrate that dual-parity and triple-parity FEC provides robustness in repairing lost data packets 752. This is particularly true in the cases of packet loss burstiness (e.g., back-to-back or back-back-back lost data packets 752). The embodiments discussed herein may be capable of repairing such consecutive losses of data packets 752, as long as the number of lost data packets 752 in a single group of data packets 752 does not exceed the number of FEC packets 754 corresponding to the group of data packets 752.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of embodiments encompassed by the disclosure as contemplated by the inventors.

What is claimed is:

1. A communication endpoint, comprising: control circuitry including:
   a packetizer configured to segment near-end data into groups of data packets; and a forward error correction (FEC) packet generator configured to:
generate at least a first row FEC packets packet, a second row FEC packet, and a third row FEC packet, each of the row FEC packets comprising a row FEC parity of respective first group of data packets, second group of data packets, and third group of data packets associated therewith;
generate at least a first diagonal FEC packet, a second diagonal FEC packet, and a third diagonal FEC packet, each of the diagonal FEC packets comprising a diagonal FEC parity of the respective first group of data packets, second group of data packets, and third group of data packets associated therewith, wherein a number of FEC data units in each of the diagonal FEC packets is at least equal to a number of data units in a longest packet of the data packets in the group plus a number one less than a number of the data packets in the group associated therewith, and wherein the third group of data packets used for the third row FEC packet and the third diagonal FEC packet at least partially overlaps with at least one of the first group of data packets or the second group of data packets; and
dynamically adjust at least one of a number of FEC packets, including the row FEC packets and the diagonal FEC packets, that are generated for each corresponding protected group of data packets or a number of maximum data packets in the corresponding protected group of data packets based, at least in part, on an determining an expected packet loss rate during transmission of the groups of data packets to the far-end communication endpoint; and
one or more communication elements operably coupled to the control circuitry and configured to transmit the groups of data packets, the row FEC packets, and the diagonal FEC packets through one or more data networks to a far-end communication endpoint.

2. The communication endpoint of claim 1, wherein the FEC packet generator is further configured to generate other diagonal FEC packets in another direction, each of the other diagonal FEC packets associated with a different group of the data packets, and each of the other diagonal FEC packets comprising another diagonal FEC parity of the group of data packets associated therewith.

3. The communication endpoint of claim 1, wherein the row FEC packets and the diagonal FEC packets each include an FEC header with indexing information indicating how the data packets are indexed into the group of data packets associated therewith.

4. The communication endpoint of claim 1, further comprising a video camera configured to capture near-end video images and provide uncompressed near-end video data corresponding thereto as the near-end data segmented into groups of data packets, wherein the control circuitry further comprises an encoder configured to compress the uncompressed near-end video data into near-end video data for segmenting into groups of data packets, and wherein the one or more communication elements are further configured to receive packetized far-end video data from the far-end communication endpoint.

5. The communication endpoint of claim 1, wherein the second group of data packets used for the second row FEC packet and the second diagonal FEC packet partially overlaps with the first group of data packets used for the first row FEC packet and the first diagonal FEC packet.

6. The communication endpoint of claim 5, wherein the third group of data packets used for the third row FEC packet and the third diagonal FEC packet partially overlaps with the second group of data packets used for the first row FEC packet and the first diagonal FEC packet.

7. The communication endpoint of claim 6, wherein the third group of data packets and the first group of data packets do not overlap.

8. The communication endpoint of claim 1, wherein the third group of data packets used for the third row FEC packet and the third diagonal FEC packet is a concatenation with first group of data packets and the second group of data packets.

9. A method of transmitting packetized data through one or more networks, the method comprising:
segmenting near-end data into data packets of data units;
indexing groups of the data packets into logically ordered set of data packets including one of the data packets in each column of the ordered set of data packets;
generating a row forward error correction (FEC) packet corresponding to at least each of a first group of the data packets a second group of data packets, and a third group of data packets, the row FEC packets each including row FEC units computed to be a row parity of each of the corresponding data packets in a different row of the ordered set of data packets;
generating one or more diagonal FEC packets corresponding to at least each of the group of the data packets, the second group of data packets, and the third group of data packets, wherein each of the one or more diagonal FEC packets include diagonal FEC units computed to be a diagonal parity along respective diagonals of the ordered set of data packets, wherein a number of diagonal FEC data units in each of the diagonal FEC packets is at least a number of data units in a longest packet of the data packets in the group plus a number one less than a number of the data packets in the group associated therewith, and wherein the third group of data packets at least partially overlaps with at least one of the first group of data packets or the second group of data packets;
dynamically adjusting at least one of a number of FEC packets, including the row FEC packets and the diagonal FEC packets, that are generated for each corresponding protected group of data packets or a number of maximum data packets in the corresponding protected group of data packets based, at least in part, on an determining an expected packet loss rate during transmission of the groups of data packets to the far-end communication endpoint; and
transmitting the groups of the data packets and the corresponding row FEC packets and one or more diagonal FEC packets through one or more networks to a far-end communication endpoint.

10. The method of claim 9, wherein transmitting the groups of the data packets and the corresponding row FEC packets and one or more diagonal FEC packets comprises transmitting the groups of the data packets through a first data channel, and transmitting the row FEC packets and the one or more diagonal FEC packets through a second data channel that is separate from the first data channel.

11. The method of claim 9, wherein segmenting the data into the data packets includes adding data headers to each of the data packets before generating the row FEC packet and the one or more diagonal FEC packets.

12. The method of claim 9, wherein generating at least two diagonal FEC packets extending in different directions that correspond to each of the groups of the data packets.

13. The method of claim 9, wherein computing the row parity and computing the diagonal parity includes at least one of an XOR function, an addition function, and a multiplication function.

14. The method of claim 9, wherein dynamically adjusting at least one of a number of FEC packets or a number of maximum data packets in the corresponding protected group of data packets includes dynamically adjusting both the number of FEC packets and the number of maximum data packets in the corresponding protected group of data packets depending on the determined packet loss percentage.

15. The method of claim 9, wherein dynamically adjusting at least one of a number of FEC packets or a number of maximum data packets in the corresponding protected group of data packets includes adjusting the number of FEC packets to be dual parity for a first data rate, and adjusting the number of FEC packets to be triple parity for a second data rate.

16. The method of claim 9, wherein dynamically adjusting at least one of a number of FEC packets or a number of maximum data packets in the corresponding protected group of data packets includes having a fixed number of FEC packets and adjusting the number of maximum data packets in the corresponding protected group of data packets depending on the determined packet loss percentage.

17. The method of claim 9, wherein dynamically adjusting at least one of a number of FEC packets or a number of maximum data packets in the corresponding protected group of data packets is responsive to both the packet loss rate and a download data rate.

18. The method of claim 9, wherein the second group of data packets used for the second row FEC packet and the second diagonal FEC packet partially overlaps with the first group of data packets used for the first row FEC packet and the first diagonal FEC packet.

19. The method of claim 18, wherein the third group of data packets used for the third row FEC packet and the third diagonal FEC packet partially overlaps with the second group of data packets used for the first row FEC packet and the first diagonal FEC packet.

20. The method of claim 19, wherein the third group of data packets and the first group of data packets do not overlap.

21. The method of claim 9, wherein the third group of data packets used for the third row FEC packet and the third diagonal FEC packet is a concatenation with first group of data packets and the second group of data packets.

22. The method of claim 9, wherein the overlapping portion of the first and second groups of data packets is not re-transmitted when the second row FEC packet and the second diagonal FEC packet are generated.

\* \* \* \* \*

UNITED STATES PATENT AND TRADEMARK OFFICE
CERTIFICATE OF CORRECTION

PATENT NO. : 10,063,261 B1
APPLICATION NO. : 14/882118
DATED : August 28, 2018
INVENTOR(S) : Alan Croxall, II et al.

Page 1 of 1

It is certified that error appears in the above-identified patent and that said Letters Patent is hereby corrected as shown below:

In the Claims

Claim 6, Column 28, Lines 4,5 change "the first row FEC packet and the first diagonal" to --the second row FEC packet and the second diagonal--

Claim 19, Column 30, Lines 15,16 change "the first row FEC packet and the first diagonal" to --the second row FEC packet and the second diagonal--

Signed and Sealed this
Thirtieth Day of October, 2018

Andrei Iancu
*Director of the United States Patent and Trademark Office*